(12) United States Patent
Kim et al.

(10) Patent No.: US 11,798,933 B2
(45) Date of Patent: Oct. 24, 2023

(54) SEMICONDUCTOR DEVICES HAVING STANDARD CELLS THEREIN WITH IMPROVED INTEGRATION AND RELIABILITY

(71) Applicant: Samsung Electronics Co., Ltd., Suwon-si (KR)

(72) Inventors: Jintae Kim, Daejeon (KR); Jaeha Lee, Hwaseong-si (KR); Dongyeon Heo, Seoul (KR)

(73) Assignee: Samsung Electronics Co., Ltd.

( * ) Notice: Subject to any disclaimer, the term of this patent is extended or adjusted under 35 U.S.C. 154(b) by 374 days.

(21) Appl. No.: 17/147,567

(22) Filed: Jan. 13, 2021

(65) Prior Publication Data

US 2021/0343699 A1    Nov. 4, 2021

(30) Foreign Application Priority Data

Apr. 29, 2020 (KR) ......................... 10-2020-0052277

(51) Int. Cl.
*H01L 23/528* (2006.01)
*H01L 23/522* (2006.01)
*G06F 30/394* (2020.01)
*H01L 27/02* (2006.01)
*H01L 29/08* (2006.01)
(Continued)

(52) U.S. Cl.
CPC ........ *H01L 27/0207* (2013.01); *G06F 30/394* (2020.01); *H01L 23/5226* (2013.01); *H01L 23/5286* (2013.01); *H01L 29/0673* (2013.01); *H01L 29/0847* (2013.01); *H01L 29/41733* (2013.01); *H01L 29/41791* (2013.01); *H01L 29/42392* (2013.01); *H01L 29/7851* (2013.01);
(Continued)

(58) Field of Classification Search
CPC ............. H01L 27/0207; H01L 23/5286; H01L 23/5226; H01L 2027/11881; H01L 23/528; H01L 2027/11888; H01L 2027/11875
See application file for complete search history.

(56) References Cited

U.S. PATENT DOCUMENTS 8,901,738 B2    12/2014  Gambino et al.
10,340,263 B2 *  7/2019  Won .................... H01L 29/0649
(Continued)

*Primary Examiner* — Anthony Ho
*Assistant Examiner* — David J Goodwin
(74) *Attorney, Agent, or Firm* — Myers Bigel, P.A.

(57) ABSTRACT

A semiconductor device includes first and second standard cells having respective semiconductor elements and first interconnection lines electrically connected to the semiconductor elements, on a substrate. A routing structure is provided, which is disposed on the first and second standard cells. The routing structure includes second interconnection lines electrically connected to the first interconnection lines. The first interconnection lines include a first power transmission line, which is configured to supply power to a semiconductor element, and a first signal transmission line electrically coupled to a semiconductor element. The second interconnection lines include: (i) a second power transmission line electrically connected to the first power transmission line and extending by a first length, (ii) a second signal transmission line electrically connected to the first signal transmission line, and (iii) a staple line electrically connected to the first power transmission line, extending on a boundary between the first and second standard cells, and extending by a second length, less than the first length.

19 Claims, 18 Drawing Sheets

(51) Int. Cl.
   *H01L 29/417*   (2006.01)
   *H01L 29/78*    (2006.01)
   *H01L 29/423*   (2006.01)
   *H01L 29/786*   (2006.01)
   *H01L 29/06*    (2006.01)
   *G06F 30/396*   (2020.01)
   *G06F 30/392*   (2020.01)

(52) U.S. Cl.
   CPC .. *H01L 29/78618* (2013.01); *H01L 29/78696* (2013.01); *G06F 30/392* (2020.01); *G06F 30/396* (2020.01)

(56) References Cited

U.S. PATENT DOCUMENTS

| | | | |
|---|---|---|---|
| 10,366,954 B1* | 7/2019 | Kim | H01L 27/0207 |
| 10,510,774 B2 | 12/2019 | Debacker et al. | |
| 10,515,178 B2 | 12/2019 | Biswas et al. | |
| 2009/0193271 A1* | 7/2009 | Chuang | H01L 27/0207 |
| | | | 713/300 |
| 2010/0025859 A1* | 2/2010 | Inoue | H01L 24/06 |
| | | | 716/136 |
| 2017/0294448 A1* | 10/2017 | Debacker | H01L 27/11807 |
| 2018/0151496 A1 | 5/2018 | Biswas et al. | |
| 2018/0166432 A1* | 6/2018 | Won | H01L 29/0649 |
| 2018/0269154 A1 | 9/2018 | Kishishita | |
| 2019/0295605 A1 | 9/2019 | Nishizaki | |
| 2019/0385999 A1 | 12/2019 | Berzins et al. | |
| 2020/0334407 A1* | 10/2020 | Kim | G06F 30/392 |
| 2022/0092249 A1* | 3/2022 | Lee | G06F 30/392 |

\* cited by examiner

SEMICONDUCTOR DEVICES HAVING STANDARD CELLS THEREIN WITH IMPROVED INTEGRATION AND RELIABILITY

REFERENCE TO PRIORITY APPLICATION

This application claims priority under 35 USC § 119(a) to Korean Patent Application No. 10-2020-0052277, filed Apr. 29, 2020, the entire contents of which is hereby incorporated herein by reference.

BACKGROUND

1. Field

Example embodiments relate to semiconductor devices used in large scale integrated circuits.

2. Description of Related Art

As demand for high performance, high speed, and/or multifunctionality in semiconductor devices increases, the degree of integration of semiconductor devices increases as well. In accordance with the trend for higher integration of semiconductor devices, research has been actively conducted to improve the design of layouts, especially with respect to the more efficient routing of interconnections, which electrically connect semiconductor devices to each other on an integrated circuit substrate.

SUMMARY

Example embodiments provide highly integrated semiconductor devices having improved integration and reliability.

According to example embodiments, a semiconductor device includes standard cells disposed in a first direction, parallel to an upper surface of a substrate, and a second direction, perpendicular to the first direction. The standard cells respectively include an active region, a gate structure intersecting the active region, source/drain regions disposed adjacent the active region (on both sides of the gate structure), and first interconnection lines electrically connected to the active region and the gate structure. The first interconnection lines include a first power transmission line and a first signal transmission line. A routing structure is provided, which is disposed on upper portions of the standard cells. The routing structure includes second interconnection lines electrically connected to the first interconnection lines, and third interconnection lines disposed on the second interconnection lines to be electrically connected to the second interconnection lines.

According to some embodiments, the standard cells include first and second standard cells adjacent to each other in the second direction. In addition, the second interconnection lines include: (i) at least one or more second power transmission lines electrically connected to the first power transmission line and arranged in a line along the entirety of the standard cells arranged in the second direction, (ii) a second signal transmission line electrically connected to the first signal transmission line and disposed on a portion of the standard cells, and (iii) a first staple line electrically connected to the first power transmission line, disposed on a boundary between the first and second standard cells to overlap the first standard cell by a first length in the second direction and to overlap the second standard cell by a second length, different from the first length, in the second direction.

According to further embodiments, a semiconductor device includes first and second standard cells disposed on a substrate and respectively including a semiconductor element and first interconnection lines electrically connected to the semiconductor element. A routing structure is disposed on the first and second standard cells, and includes second interconnection lines electrically connected to the first interconnection lines. The first interconnection lines include a first power transmission line supplying power to the semiconductor element and a first signal transmission line applying a signal to the semiconductor element. And, the second interconnection lines include a second power transmission line electrically connected to the first power transmission line and extending by a first length, a second signal transmission line electrically connected to the first signal transmission line, and a staple line electrically connected to the first power transmission line, disposed on a boundary between the first and second standard cells, and extending by a second length, less than the first length.

According to additional embodiments, a semiconductor device includes standard cells disposed on a substrate. These standard cells respectively include an active region, a gate structure intersecting the active region, source/drain regions disposed adjacent the active region, on both sides of the gate structure, and first interconnection lines including first power transmission lines electrically connected to the active region. A routing structure is provided, which is disposed on upper portions of the standard cells. The routing structure includes second interconnection lines including staple lines electrically connected to the first power transmission lines, and third interconnection lines including third power transmission lines disposed on the second interconnection lines to be electrically connected to the staple lines. The first power transmission lines extend in a first direction along boundaries of the standard cells, whereas the staple lines are disposed to traverse boundaries between the standard cells among the boundaries of the standard cells, overlap the first power transmission lines and the third power transmission lines and extend in a second direction, perpendicular to the first direction. The third power transmission lines overlap the first power transmission lines to extend in the first direction.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1A:
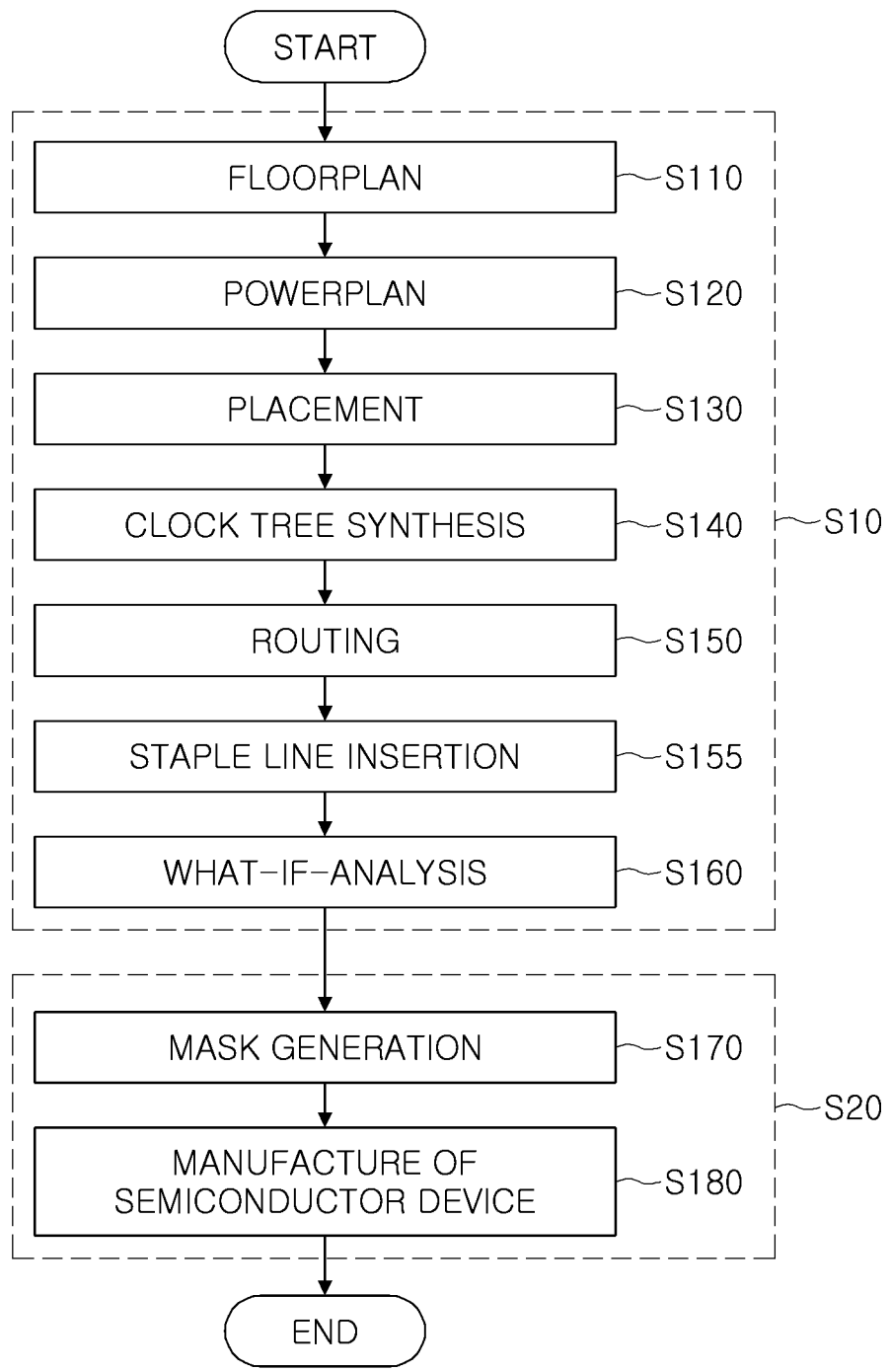
FIGS. 1A and 1B are flow charts illustrating a method of designing and manufacturing a semiconductor device according to example embodiments.
Figure 1B:
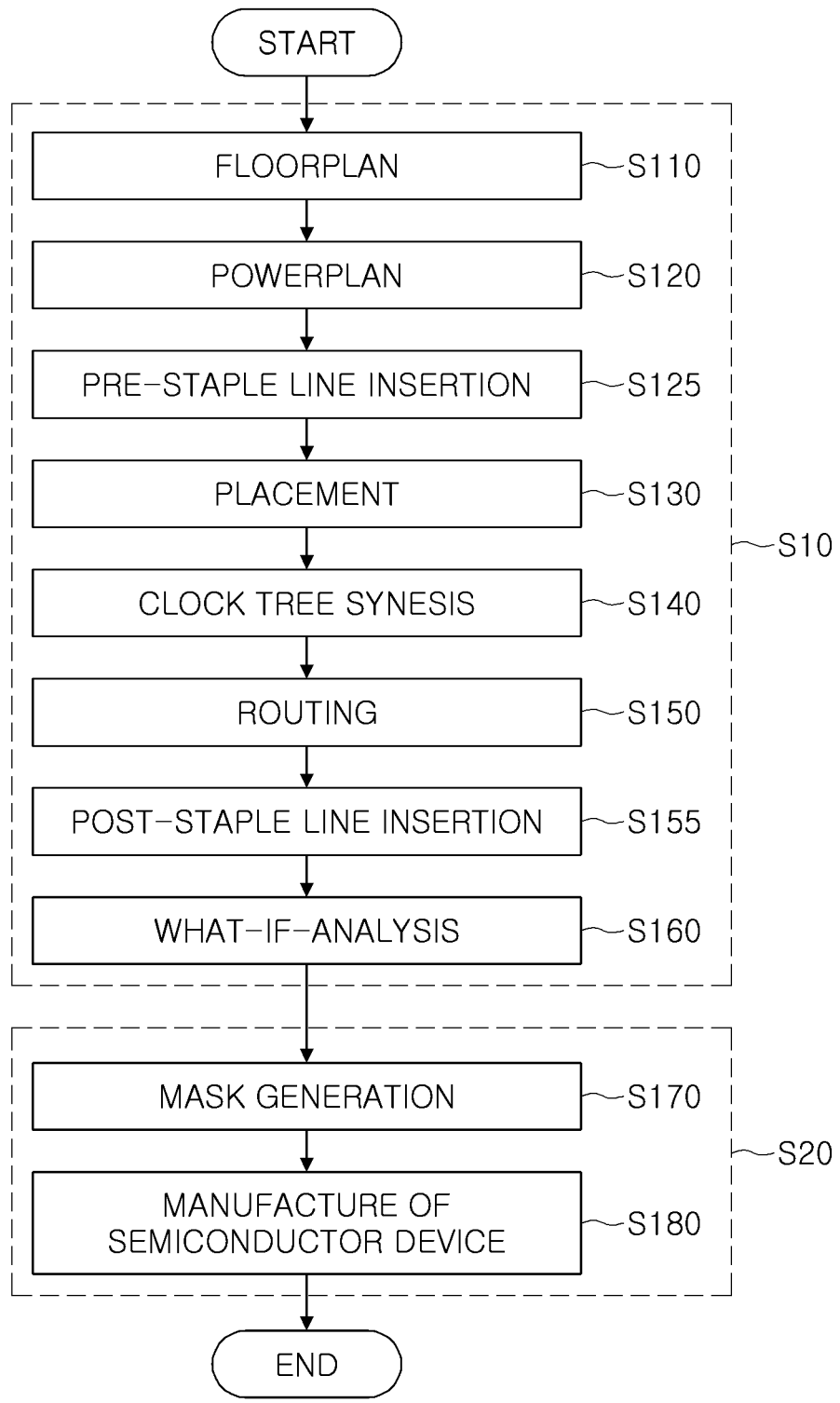

FIGS. 1A and 1B are flow charts illustrating a method of designing and manufacturing a semiconductor device according to example embodiments. Referring to FIG. 1A, a method of designing and manufacturing a semiconductor device may include a design operation S10 of designing a semiconductor device and a process operation S20 of manufacturing a semiconductor device. The design operation S10 of designing a semiconductor device is an operation of designing a layout for a circuit, and may be performed using a tool for designing the circuit. The tool may be a program including a plurality of commands executed by a processor. Accordingly, the design operation S10 of designing a semiconductor device may be a computer implemented operation for designing the circuit. The process operation S20 of manufacturing the semiconductor device is an operation of manufacturing a semiconductor device based on a designed layout, and may be performed in a semiconductor process module.

The design operation S10 of designing a semiconductor device includes a floorplan operation S110, a powerplan operation S120, a placement operation S130, and a Clock Tree Synthesis (CTS) operation S140, a routing operation S150, a staple line insertion operation S155, and a what-if-analysis operation S160.

The floorplan operation S110 may be an operation of physically designing by cutting and moving a logically designed schematic circuit. In the floorplan operation S110, a memory or a functional block may be disposed. In this operation, for example, functional blocks to be disposed adjacently may be identified, and space for the functional blocks may be allocated in consideration of available space and required performance. For example, the floorplan operation S110 may include an operation of creating a site-row and an operation of forming a metal routing track on the created site-row. The site-row is a frame in which standard cells stored in a cell library are to be disposed according to a prescribed design rule. The metal routing track is a virtual line on which interconnections are formed later.

The powerplan operation S120 may be an operation of disposing patterns of interconnections connecting the local power, for example, a ground or a driving voltage, to the functional blocks. For example, the patterns of interconnections that connect the power or the ground may be generated in the form of a net, such that power may be evenly supplied to the entire chip. The patterns may include power rails, and in this operation, the patterns may be generated in the net form through various rules.

The placement operation S130 is an operation of disposing patterns of elements constituting the functional block, and may include disposing standard cells. In detail, in example embodiments, each of the standard cells may include semiconductor elements and first interconnection lines connected thereto. The first interconnection lines may include a power transmission line connecting a power supply or the ground, and a signal transmission line transmitting a control signal, an input signal, or an output signal. Empty areas may be generated between the standard cells disposed in this operation, and the empty areas may be filled by filler cells. In a manner different from the standard cells including an operable semiconductor device, a unit circuit implemented with semiconductor elements, and the like, the filler cells may be dummy regions. By this operation, the shape or size of a pattern for actually constructing transistors and interconnections to be formed on a semiconductor substrate may be defined. For example, to actually form an inverter circuit on a semiconductor substrate, layout patterns such as PMOS, NMOS, N-WELL, gate electrode, and interconnections to be disposed thereon may be appropriately disposed.

The CTS operation S140 may be an operation of generating patterns of signal lines of a central clock related to a response time that determines performance of a semiconductor device.

The routing operation S150 may be an operation of generating a routing structure or an upper interconnection structure including second interconnection lines connecting disposed standard cells. In detail, a power distribution network (PDN) may be implemented at this stage. The second interconnection lines are electrically connected to the first interconnection lines in the standard cells, and may electrically connect the standard cells to each other, or may be connected to power or ground. The second interconnection lines may be configured to be physically formed on upper portions of the first interconnection lines.

The staple line insertion operation S155 may be an operation of inserting staple lines, for example, between the second interconnection lines among routing structures generated in the routing operation S150. The staple line may be, for example, an element that connects the first interconnection line that is a power rail provided therebelow, and a third interconnection line that is a power rail provided thereon. The staple line may be referred to by other terms, such as a staple via or the like. For example, in a power rail, the first interconnection line may be connected to the third interconnection line through the staple line having a relatively short length. By inserting these staple lines, the ohmic drop in power rails, such as IR drop or a resistive voltage drop, may be advantageously reduced. The staple line should be designed and inserted so as not to overlap with other second interconnection lines used for signal transmission and the like. Therefore, a design method of inserting the staple line to the maximum while avoiding collision with the second interconnection lines generated in the routing operation S150 may be applied.

The what-if-analysis operation S160 may be an operation of verifying and correcting the generated layout. Examples of verification items may include Design Rule Check (DRC) to check and verify that the layout is correct according to the design rules, Electronical Rule Check (ERC) to check and verify that the layout is properly performed without electrical disconnection, Layout vs Schematic (LVS) to check and verify that the layout matches the gate-level netlist, and the like.

The process operation S20 of manufacturing a semiconductor device may include a mask generation operation S170 and a semiconductor device manufacturing operation S180.

The mask generation operation S170 may include an operation of generating mask data for forming various patterns on a plurality of layers by performing Optical Proximity Correction (OPC) or the like on the layout data generated in the design operation S10 of designing a semiconductor device, and an operation of manufacturing a mask using the mask data. The OPC may be to correct a distortion phenomenon that may occur in a photolithography process. The mask may be fabricated by depicting layout patterns using a chromium thin film applied on a glass or quartz substrate.

In the semiconductor device manufacturing operation S180, various types of exposure and etching processes may be repeatedly performed. Through these processes, patterns formed in the layout design may be sequentially formed on the silicon substrate. In detail, various semiconductor processes are performed on a semiconductor substrate such as a wafer, using a plurality of masks, to form a semiconductor device in which an integrated circuit is implemented. The semiconductor processes may include a deposition process, an etching process, an ion implantation process, a cleaning process, and the like. In addition, the semiconductor processes may include a packaging process of mounting a semiconductor device on a PCB and encapsulating with a sealing material, or may include a test process for the semiconductor device or a package thereof.

Referring to FIG. 1B, a method of designing and manufacturing a semiconductor device may further include a pre-staple line insertion operation S125 performed after the powerplan operation S120. Accordingly, unlike in FIG. 1A, the staple line insertion operation S155 after the routing operation S150 is referred to as a post-staple line insertion operation S155.

The pre-staple line insertion operation S125 may be an operation of first inserting a portion of the staple lines after generating patterns of interconnections connecting the power or ground in the powerplan operation S120. In this operation, some staple lines may be first generated in consideration of the ohmic drop.

Next, in the post-staple line insertion operation S155, as described above with reference to FIG. 1A, staple lines may be additionally inserted after the routing operation S150. Accordingly, the staple lines inserted in the post-staple line insertion operation S155 may form the entire staple lines together with the staple lines inserted in the pre-staple line insertion operation S125.

Figure 2:
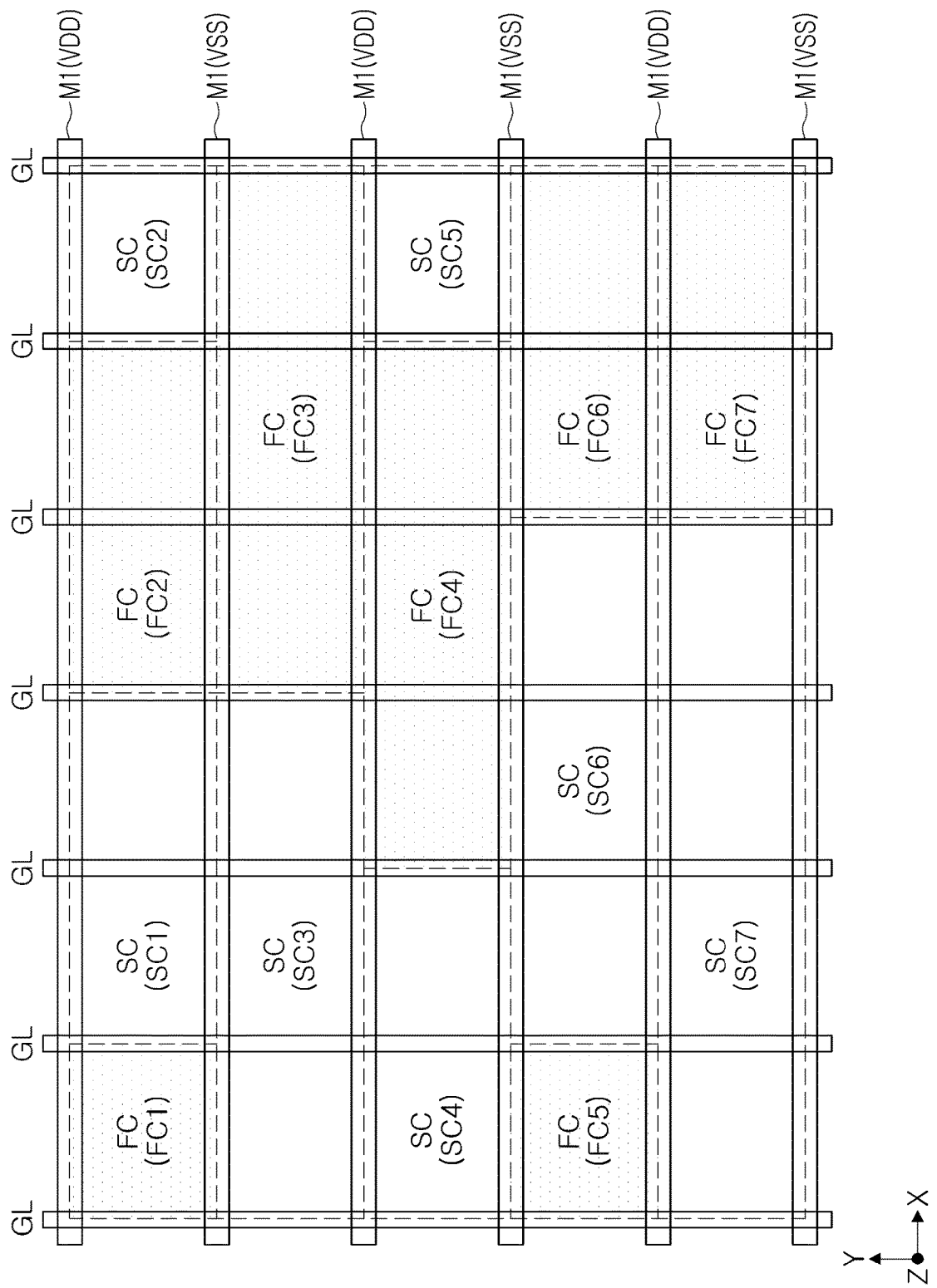
FIG. 2 is a schematic plan view of a semiconductor device according to example embodiments.

FIG. 2 is a schematic plan view of a semiconductor device according to example embodiments. Referring to FIG. 2, a semiconductor device may include standard cell areas SC and filler cell areas FC. First to seventh standard cells SC1-SC7 may be disposed in the standard cell areas SC, thereby implementing circuits. First to seventh filler cells FC1-FC7 may be disposed in the filler cell areas FC, thereby forming a dummy area. The shapes and numbers of the first to seventh standard cells SC1-SC7 and the first to seventh filler cells FC1-FC7 illustrated in FIG. 2 are provided as examples, and may be variously changed according to example embodiments. The semiconductor device may include first power transmission lines M1(VDD) and M1(VSS), and gate lines GL.

The first power transmission lines M1(VDD) and M1(VSS) may be power rails and may extend in a first direction, for example, in the X direction. The first power transmission lines M1(VDD) and M1(VSS) may include first high-power transmission lines M1(VDD) supplying a first voltage, and first low-power transmission lines M1(VSS) supplying a second voltage lower than the first voltage. The first high-power transmission lines M1(VDD) and the first low-power transmission lines M1(VSS) may be alternately arranged while being spaced apart from each other in the second direction, intersecting the first direction, for example, in the Y direction. For example, the first power transmission lines M1(VDD) and M1(VSS) may extend along boundaries of the standard cell areas SC and the filler cell areas FC, but according to example embodiments, at least one of the first power transmission lines M1(VDD) and M1(VSS) may be disposed to traverse at least one of the standard cell areas SC and the filler cell areas FC.

The gate lines GL may extend in the second direction and may be disposed spaced apart from each other in the first direction. The gate lines GL may include gate electrodes that provide a semiconductor device, and dummy gate electrodes that do not actually perform electrical functions but provide advantageous functions for the layout. For example, at least a portion of the gate lines GL disposed at boundaries between the standard cell areas SC and the filler cell areas FC may include the dummy gate electrode.

Figure 3:
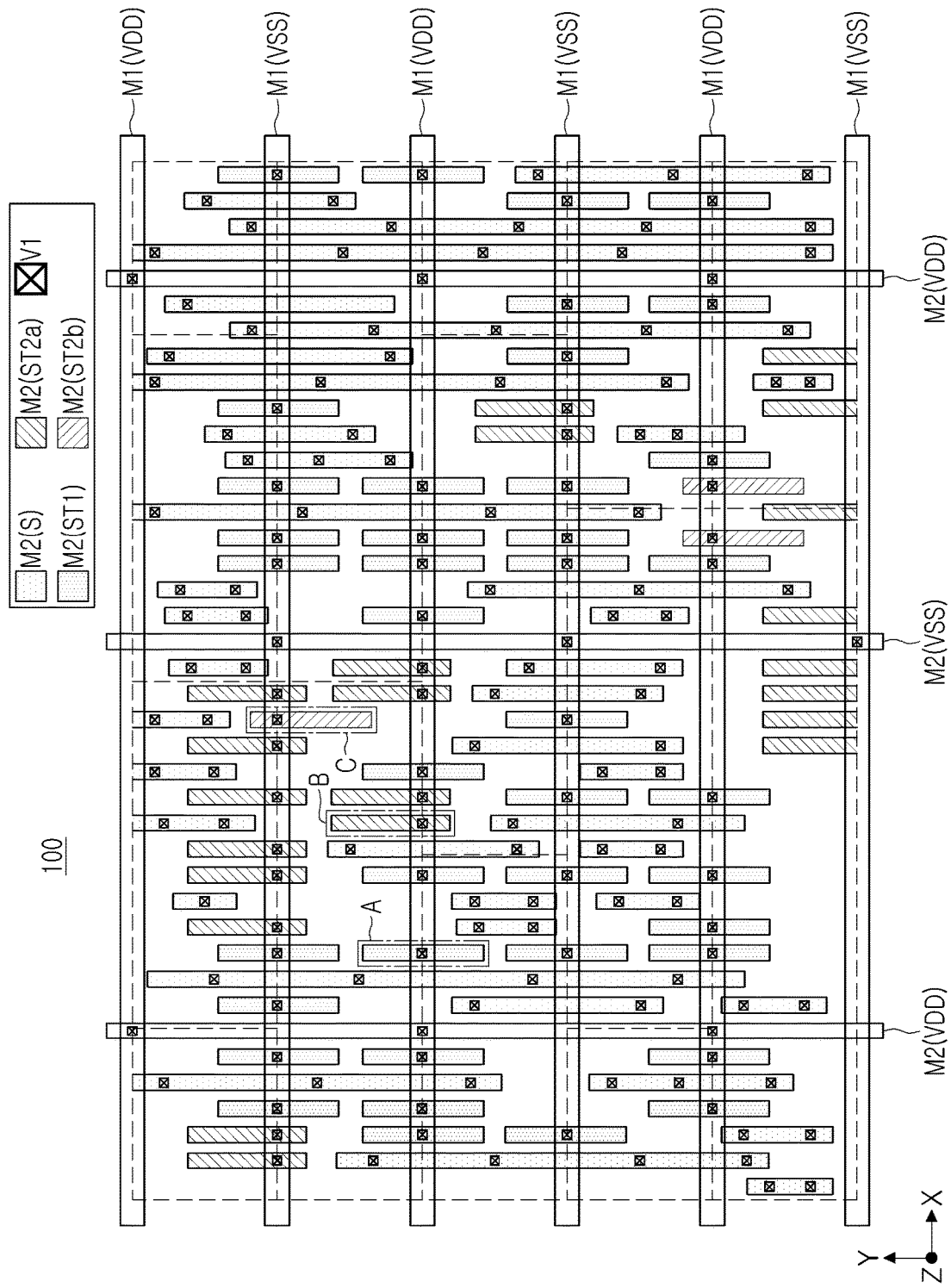
FIG. 3 is a layout diagram of a semiconductor device according to example embodiments.
Figure 4A:
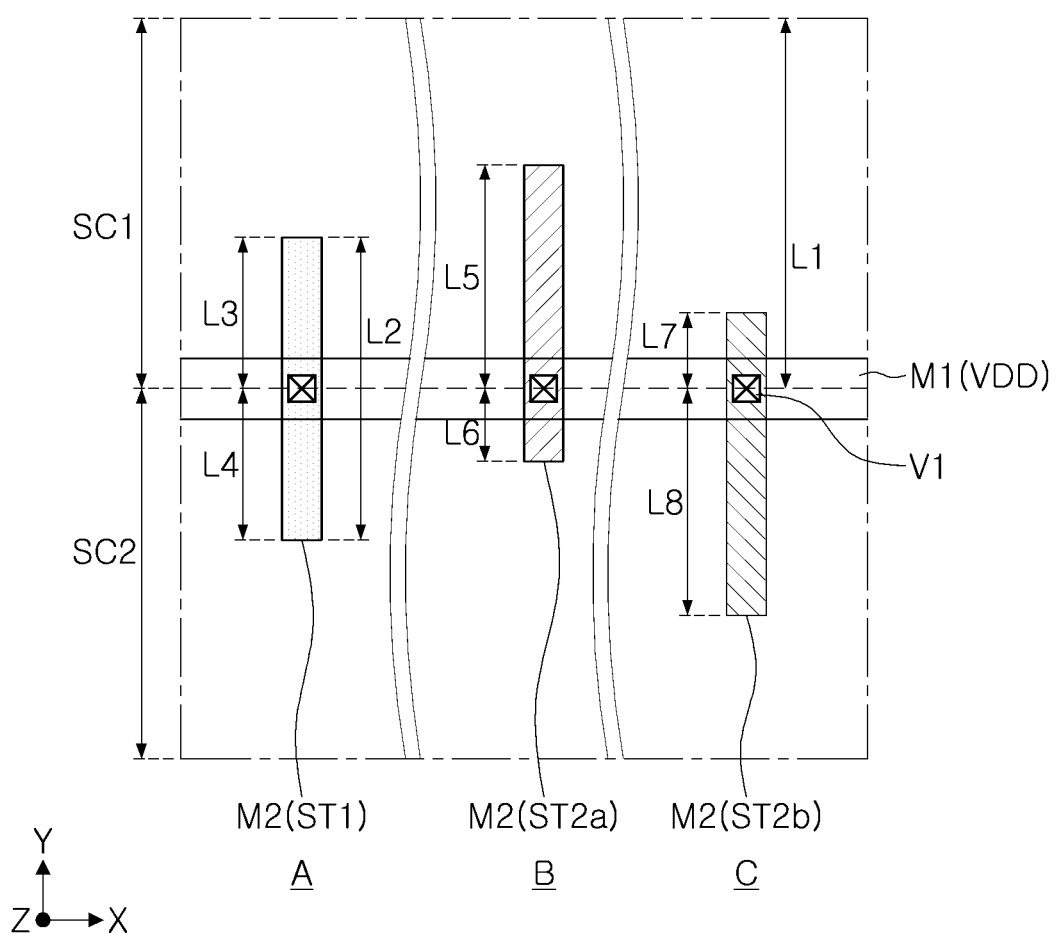
FIGS. 4A and 4B are diagrams illustrating a layout of a semiconductor device according to example embodiments.
Figure 4B:
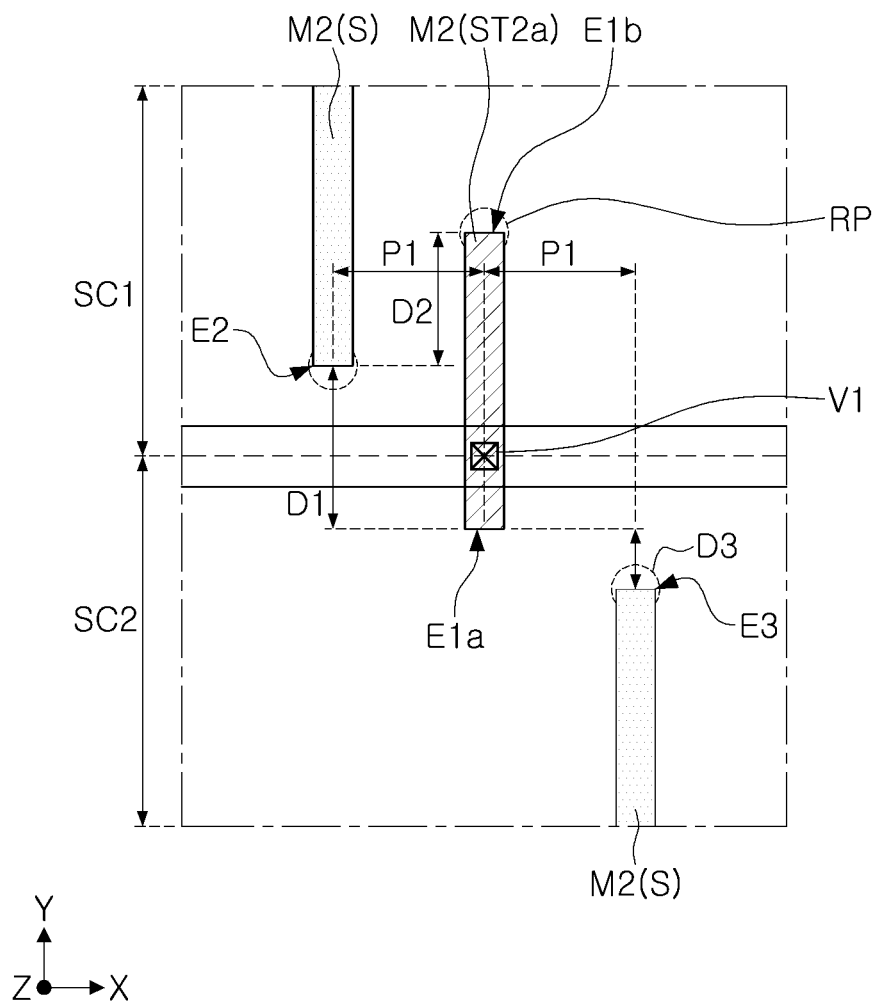

FIG. 3 is a layout diagram of a semiconductor device according to example embodiments. FIG. 3 illustrates second interconnection lines M2 electrically connected to the standard cells and the filler cells of the semiconductor device of FIG. 2. FIGS. 4A and 4B are diagrams illustrating a layout of a semiconductor device according to example embodiments. In FIG. 4A, areas 'A' and 'B', and 'C' of FIG. 3 are enlarged and illustrated.

Referring to FIG. 3, a semiconductor device 100 may include first interconnection lines M1, second interconnection lines M2, and first vias V1 vertically connecting the first interconnection lines M1 and the second interconnection lines M2. FIG. 3 illustrates the first power transmission lines M1(VDD) and M1(VSS) among the first interconnection lines M1, and second power transmission lines M2(VDD) and M2(VSS), second signal transmission lines M2(S), and first and second staple lines M2(ST1), M2(ST2a) and M2(ST2b) among the second interconnection lines M2.

The first power transmission lines M1(VDD) and M1(VSS) of the first interconnection lines M1 may extend in the first direction, for example, the X direction, as described above with reference to FIG. 2. The second interconnection lines M2 may extend in the second direction, intersecting or perpendicular to the first interconnection lines M1, for example, in the Y direction. The second interconnection lines M2 may be included in the routing structure above the standard cells and the filler cells, and according to example embodiments, a portion thereof may also be included in the standard cells. For example, second interconnection lines M2 connecting the first interconnection lines M1 within one standard cell may be included in the standard cells.

The second power transmission lines M2(VDD) and M2(VSS) may include second high-power transmission lines M2(VDD) and second low-power transmission lines M2(VSS). The second high-power transmission lines M2(VDD) and the second low-power transmission lines M2(VSS) may be alternately arranged spaced apart from each other in the X direction. The second high-power transmission lines M2(VDD) may be connected to the first high-power transmission lines M1(VDD) through the first vias V1, and the second low-power transmission lines M2(VSS) may be connected to the first low-power transmission lines M1(VSS) through the first vias V1.

The second power transmission lines M2(VDD) and M2(VSS) may include at least one or more lines, arranged in a line along the entirety of the standard cells arranged in the Y direction. For example, as illustrated in FIG. 3, each of the second power transmission lines M2(VDD) and M2(VSS) may include a line extending further than standard cells arranged in the Y direction. For example, the second power transmission lines M2(VDD) and M2(VSS) may be disposed on the entirety of the standard cells disposed in the Y direction. Accordingly, the second power transmission lines M2(VDD) and M2(VSS) may have a length greater than a length of the second signal transmission lines M2(S) and the first and second staple lines M2(ST1), M2(ST2a) and M2(ST2b). On the other hand, according to example embodiments, each of the second power transmission lines M2(VDD) and M2(VSS) may include a plurality of lines arranged in a line in the Y direction, which will be described in more detail with reference to FIG. 7 below.

The second signal transmission lines M2(S) may be disposed on upper portions of a plurality of standard cells to electrically connect adjacent standard cells. The second signal transmission lines M2(S) may be connected to first signal transmission lines of the first interconnection lines M1 through the first vias V1. The second signal transmission lines M2(S) may transmit a control signal, an input signal, or an output signal. In example embodiments, some of the second signal transmission lines M2(S), for example, second signal transmission lines M2(S) connecting the first interconnection lines M1 within one standard cell, may be included in the standard cells. The second signal transmission lines M2(S) may have a length shorter than that of the second power transmission lines M2(VDD) and M2(VSS), and at least a portion of the second signal transmission lines M2(S) may have a length greater than that of the first and second staple lines (M2(ST1), M2(ST2a) and M2(ST2b).

The first and second staple lines M2(ST1), M2(ST2a) and M2(ST2b) may be spaced apart from the second power transmission lines M2(VDD) and M2(VSS) and the second signal transmission lines M2(S) in the X direction and the Y direction, and may be disposed between the second power transmission lines M2(VDD) and M2(VSS), and the second signal transmission lines M2(S). The first and second staple lines M2(ST1), M2(ST2a) and M2(ST2b) may be disposed on boundaries of the standard cells in the Y direction. In detail, the first and second staple lines M2(ST1), M2(ST2a) and M2(ST2b) may be disposed to traverse the boundaries, on the upper portions of the boundaries. Accordingly, the first and second staple lines M2(ST1), M2(ST2a) and M2(ST2b) may overlap the boundaries in plan view.

The first and second staple lines M2(ST1), M2(ST2a) and M2(ST2b) may be connected to the first power transmission lines M1(VDD) and M1(VSS) through the first vias V1. The first and second staple lines M2(ST1), M2(ST2a) and M2(ST2b) may be connected to the first power transmission lines M1(VDD) and M1(VSS) through the first vias V1 in an area overlapping the first power transmission lines M1(VDD) and M1(VSS). As described above, power may be mainly transmitted by the second power transmission lines M2(VDD) and M2(VSS), among the second interconnection lines M2, but the first and second staple lines M2(ST1), M2(ST2a) and M2(ST2b) are further disposed, thereby reducing ohmic drop in power transmission lines as described above.

Referring to FIG. 4A, the first and second staple lines M2(ST1), M2(ST2a) and M2(ST2b) may have a linear shape in which the width in the Y direction is greater than the width in the X direction. The first and second staple lines M2(ST1), M2(ST2a) and M2(ST2b) may have a length L2 less than a length L1 of the standard cells SC1 and SC2 in the Y direction. The first and second staple lines M2(ST1), M2(ST2a) and M2(ST2b) may have substantially the same size, but the sizes thereof are not limited thereto. The arrangement types of the first and second staple lines M2(ST1), M2(ST2a) and M2(ST2b) may be different from each other, based on the boundaries of the first and second standard cells SC1 and SC2 adjacent to each other in the Y direction. For example, the first and second staple lines M2(ST1), M2(ST2a) and M2(ST2b) may have different arrangement forms, based on the center line of the first power transmission lines M1(VDD) and M1(VSS) disposed therebelow and overlapped with the first and second staple lines M2(ST1), M2(ST2a) and M2(ST2b), in the Y direction.

In the case of the first staple lines M2(ST1), a length L3 overlapping the first standard cell SC1 based on the boundary may be substantially equal to a length L4 overlapping the second standard cell SC2. In 2-1 staple lines M2(ST2a), a length L5 overlapping the first standard cell SC1 based on the boundary may be greater than a length L6 overlapping the second standard cell SC2. Conversely, in 2-2 staple lines M2(ST2b), a length L7 overlapping the first standard cell SC1 based on the boundary may be less than a length L8 overlapping the second standard cell SC2. For example, L6:L5 and L7:L8 may be greater than 1/6. For example, L6:L5 and L7:L8 may range from 1:1 to 1:6, in detail, may range from 1:3 to 1:4.

Referring to FIG. 4B, respective arrangement positions of the first and second staple lines M2(ST1), M2(ST2a) and M2(ST2b) may be determined in consideration of the arrangement of other second interconnection lines M2 such as the second power transmission lines M2(VDD) and M2(VSS) and the second signal transmission lines M2(S).

The first and second staple lines M2(ST1), M2(ST2a) and M2(ST2b) are spaced apart from the other second interconnection lines M2 at the same pitch P1 in the X direction. In this specification, the pitch indicates the length between the center and the center in the X direction. Since the first and second staple lines M2(ST1), M2(ST2a) and M2(ST2b) have three different forms based on the boundary of the first and second standard cells SC1 and SC2 as described above with reference to FIG. 4A, one of the three forms may be selected by considering the arrangement of the adjacent second interconnection lines M2, for example, the second signal transmission lines M2(S) as illustrated in FIG. 4B.

In detail, the 2-1 staple lines M2(ST2a) illustrated in FIG. 4B have ends Ea and E1b which are spaced apart from ends E2 and E3 of the second signal transmission lines M2(S) adjacent to the 2-1 staple lines M2(ST2a), by predetermined distances D1, D2 and D3, in the Y direction. For example, any one of the first and second staple lines M2(ST1), M2(ST2a) and M2(ST2b) may be selected such that the distances D1, D2 and D3 are greater than or equal to a critical distance. The critical distance may be determined according to the design rules of the layout. For example, the critical distance may be determined in consideration of an end shape RP formed when the layout is actually patterned to form a pattern in the semiconductor device. As illustrated in FIG. 4B, in the semiconductor device, when the second interconnection lines M2 are patterned to have a relatively expanded shape on the end, the first and second staple lines M2(ST1), M2(ST2a) and M2(ST2b) may be selected and arranged, considering the expanded size, in such a manner that the ends E1a and E1b of the first and second staple lines M2(ST1), M2(ST2a) and M2(ST2b) are not arranged side by side in the X direction with the ends E2 and E3 of other second interconnection lines M2, such as the second signal transmission lines M2(S) and the second power transmission lines M2(VDD) and M2(VSS) and may be spaced apart therefrom at a predetermined distance in the Y direction.

In the semiconductor device 100 of the example embodiment of FIG. 3, by applying the first and second staple lines M2(ST1), M2(ST2a) and M2(ST2b) having three types of arrangement form, the number of staple lines to be inserted may be significantly increased while maintaining the design rule in relation to other second interconnection lines M2.

Figure 5:
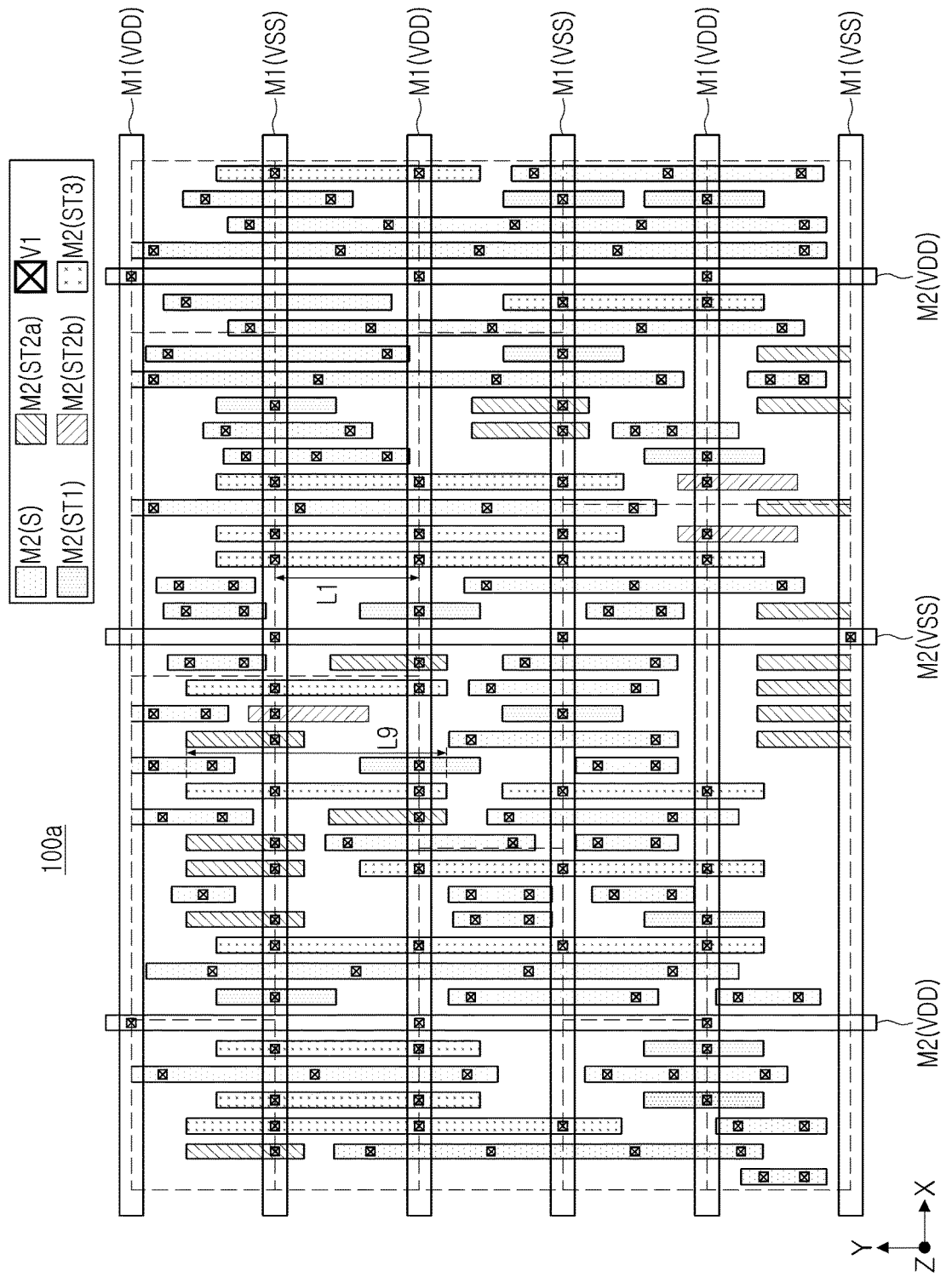
FIGS. 5 and 6 are layout diagrams of semiconductor devices according to example embodiments.
Figure 6:
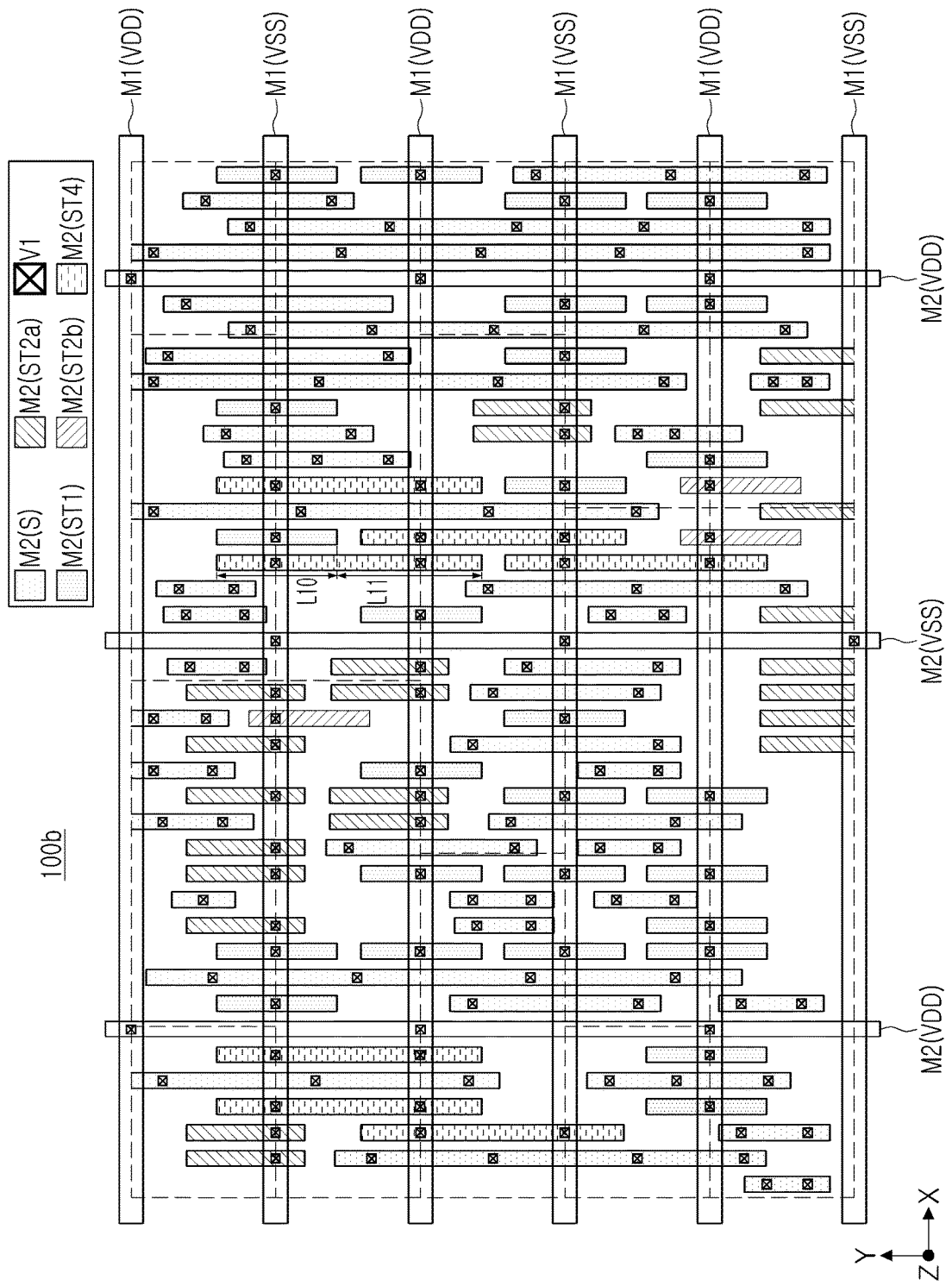

FIGS. 5 and 6 are layout diagrams of a semiconductor device according to example embodiments. Referring to FIG. 5, a semiconductor device 100a may further include third staple lines M2(ST3) in addition to the first and second staple lines M2(ST1), M2(ST2a) and M2(ST2b).

The third staple lines M2(ST3) may extend further than one standard cell and may be connected to the first power transmission lines M1(VDD) and M1(VSS) through the first vias V1. For example, a length L9 of the third staple lines M2(ST3) in the Y direction may be greater than the length L1 of the standard cell in the Y direction. However, not all of the third staple lines M2(ST3) should have the same length, and may have various lengths greater than the length L1 of the standard cell in the Y direction.

The semiconductor device 100a is illustrated to include all of the first to third staple lines M2(ST1), M2(ST2a), M2(ST2b), and M2(ST3), but a portion thereof may be omitted. For example, the semiconductor device 100a may not include the first staple lines M2(ST1), or may not include at least one of the 2-1 staple lines M2(ST2a) and the 2-2 staple lines M2(ST2b).

Referring to FIG. 6, a semiconductor device 100b may further include fourth staple lines M2(ST4) in addition to the first and second staple lines M2(ST1), M2(ST2a) and M2(ST2b). The fourth staple lines M2(ST4) have substantially the same length in both directions from the center line of the standard cells in the Y direction, and may be connected to the first power transmission lines M1(VDD) and M1(VSS) through the first vias V1. For example, the fourth staple lines M2(ST4) may have substantially the same length L10 extending upwardly from the center line of the standard cell, as a length L11 extending downwardly from the center line in the Y direction in the drawing. The fourth staple lines M2(ST4) traverse boundary lines of the standard cells in the Y direction and may be disposed to have various lengths in a range satisfying the above condition.

The semiconductor device 100b is illustrated to include first and second staple lines M2(ST1), M2(ST2a) and M2(ST2b), and the fourth staple lines M2(ST4), but a portion thereof may be omitted, or may further include the third staple lines M2(ST3) of FIG. 5.

Figure 7:
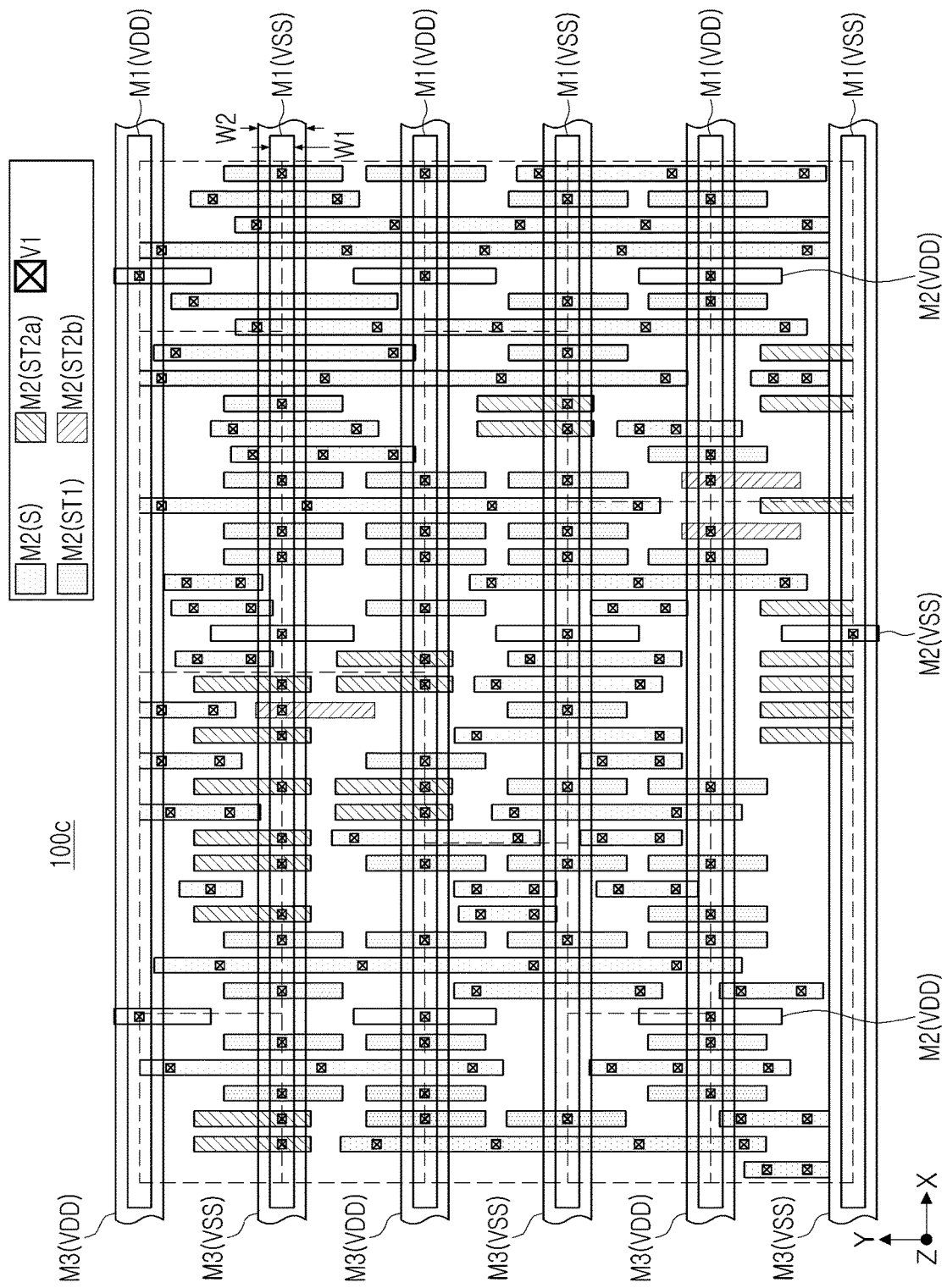
FIG. 7 is a layout diagram of a semiconductor device according to example embodiments.

FIG. 7 is a layout diagram of a semiconductor device according to example embodiments. Referring to FIG. 7, a semiconductor device 100c may further include third power transmission lines M3(VDD) and M3(VSS) that are power rails. Further, in the semiconductor device 100c, the disposition of the second power transmission lines M2(VDD) and M2(VSS) may be different from that in the example embodiment of FIG. 3.

The third power transmission lines M3(VDD) and M3(VSS) may be interconnection lines included in third interconnection lines M3 positioned on upper portions of the second interconnection lines M2. The third power transmission lines M3(VDD) and M3(VSS) may be disposed to overlap the first power transmission lines M1(VDD) and M1(VSS). The third power transmission lines M3(VDD) and M3(VSS) may have a width W2 greater than a width W1 of the first power transmission lines M1(VDD) and M1(VSS). Accordingly, the third power transmission lines M3(VDD) and M3(VSS) may be disposed to overlap the entirety of the first power transmission lines M1(VDD) and M1(VSS).

The third power transmission lines M3(VDD) and M3(VSS) may be connected to the second interconnection lines M2 through separate second vias. For example, the second vias may be disposed on the second interconnection lines M2 in an area in which the third power transmission lines M3(VDD) and M3(VSS) overlap the second power transmission lines M2(VDD) and M2(VSS) and the first and second staple lines M2(ST1), M2(ST2a) and M2(ST2b) of the second interconnection lines M2. The power supply voltage supplied through the third power transmission lines M3(VDD) and M3(VSS) passes, in the process of being transmitted to the first power transmission lines M1(VDD) and M1(VSS)), through the staple lines disposed perpendicular thereto and including the first and second staple lines M2(ST1), M2(ST2a) and M2(ST2b) having a relatively short length. In example embodiments, the above arrangement of the third power transmission lines M3(VDD) and M3(VSS) may also be applied to the example embodiments of FIGS. 5 and 6.

Each of the second power transmission lines M2(VDD) and M2(VSS) may be intermittently disposed in the Y direction. Each of the second power transmission lines M2(VDD) and M2(VSS) may include a plurality of lines arranged in a line in the Y direction. For example, the second high-power transmission lines M2(VDD) may be arranged in a line in the Y direction, while overlapping the first high-power transmission lines M1(VDD) disposed therebelow and the third high-power transmission lines M3(VDD) disposed thereon. The second low-power transmission lines M2(VSS) may overlap the first low-power transmission lines M1(VSS) disposed therebelow and the third low-power transmission lines M3(VSS) disposed thereon, and may be arranged in a line in the Y direction.

As described above, even when the second power transmission lines M2(VDD) and M2(VSS) are intermittently disposed, another second interconnection line M2 may not be interposed between the plurality of second power transmission lines M2(VDD) and M2(VSS) arranged in a line. In example embodiments, the respective lengths of the plurality of second power transmission lines M2(VDD) and M2(VSS) arranged in a line in the Y direction may be variously changed. For example, the length of each of the plurality of second power transmission lines M2(VDD) and M2(VSS) may be the same as or greater than that of each of the first and second staple lines M2(ST1), M2(ST2a) and M2(ST2b). In example embodiments, such an arrangement of the second power transmission lines M2(VDD) and M2(VSS) may also be applied to the example embodiments of FIGS. 3 to 6.

Figure 8A:
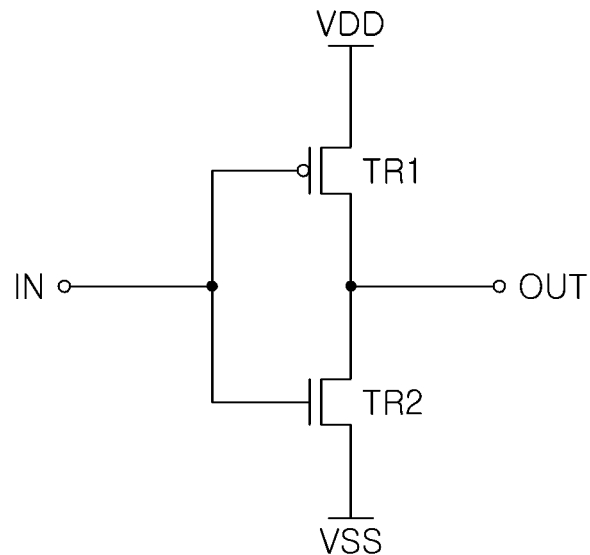
FIGS. 8A and 8B are circuit diagrams of unit circuits provided by standard cells included in a semiconductor device according to example embodiments, respectively.
Figure 8B:
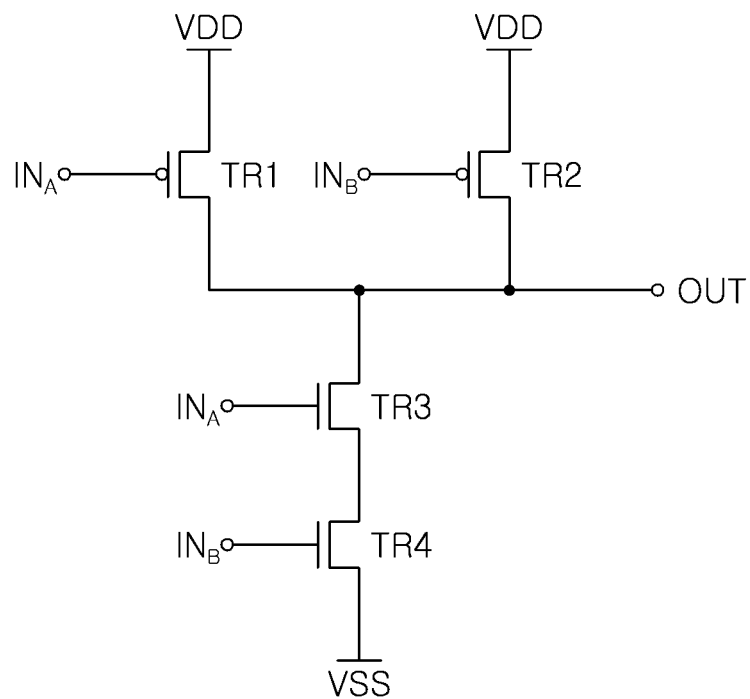

FIGS. 8A and 8B are circuit diagrams of unit circuits provided by standard cells included in semiconductor devices according to example embodiments, respectively. Referring to FIG. 8A, the unit circuit may be an inverter circuit. The inverter circuit may include a pull-up device TR1 receiving a first power supply VDD and a pull-down device TR2 receiving a second power supply VSS, and gates of the pull-up device TR1 and the pull-down device TR2 may be connected to each other to provide an input terminal IN. One of source/drain regions of the pull-up device TR1 and one of source/drain regions of the pull-down device TR2 may be connected to each other to provide an output terminal OUT.

Referring to FIG. 8B, the unit circuit may be a NAND circuit. The NAND circuit may include first and second pull-up devices TR1 and TR2, and first and second pull-down devices TR3 and TR4 connected to each other in series. The first and second pull-up devices TR1 and TR2 may be connected to the first power supply VDD. The first and second pull-down devices TR3 and TR4 may be connected to each other in series, and the second pull-down device TR4 may be connected to the second power supply VSS.

Gates of the first pull-up device TR1 and the first pull-down device TR3 may be connected to each other to provide a first input terminal $IN_A$, and gates of the second pull-up device TR2 and the second pull-down device TR4 may be connected to each other to provide a second input terminal $IN_B$. One of source/drain regions of each of the first and second pull-up devices TR1 and TR2 and one of source/drain regions of the first pull-down device TR3 may be connected to each other to provide an output terminal OUT. However, the inverter circuit and the NAND circuit as illustrated in FIGS. 8A and 8B are only examples of unit circuits that may be provided by a standard cell, and in addition to these circuits, the standard cells may provide various circuits such as NOR standard cells and the like.

Figure 9A:
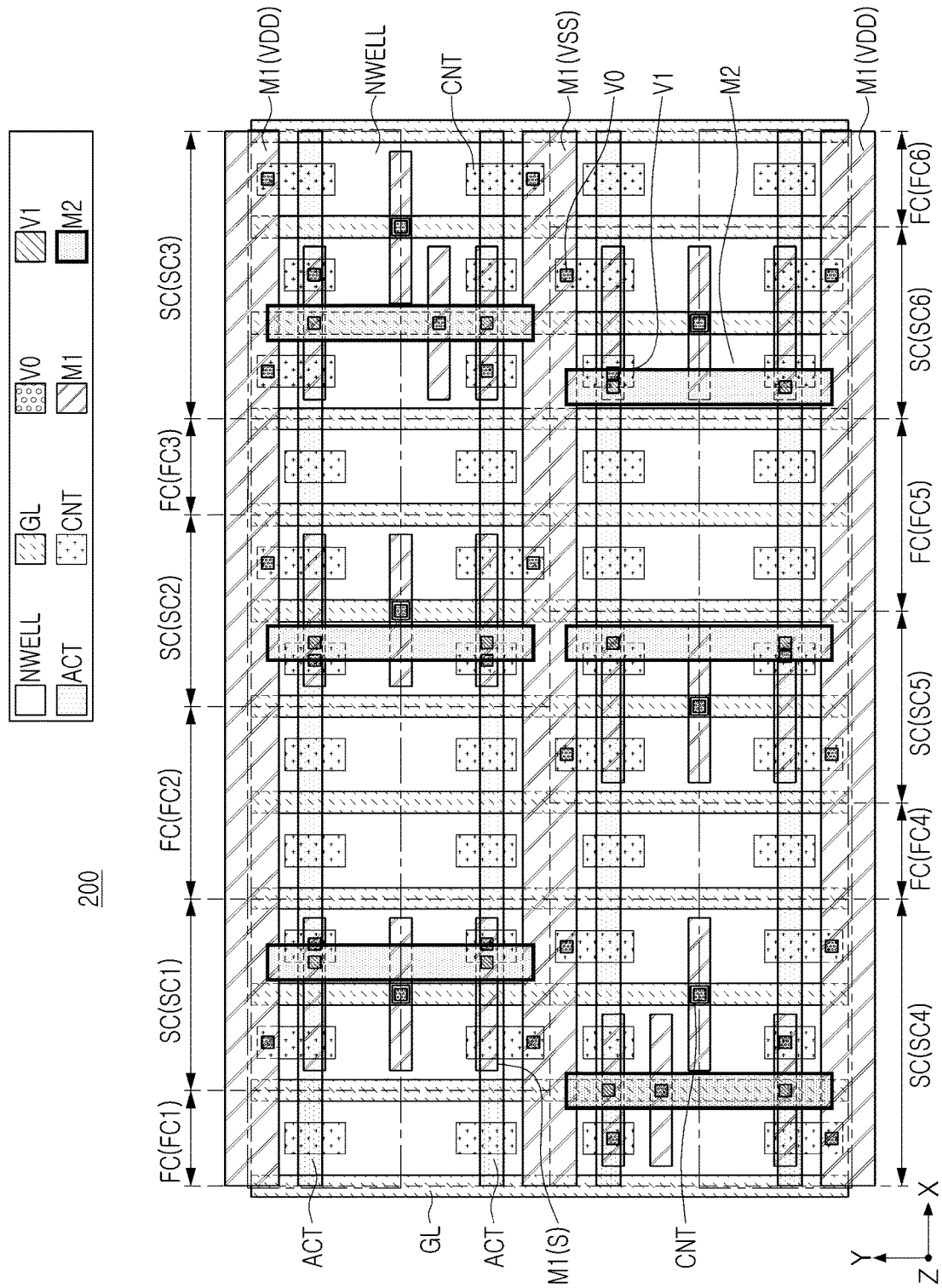
FIGS. 9A to 9C are layout diagrams of a semiconductor device according to example embodiments.
Figure 9B:
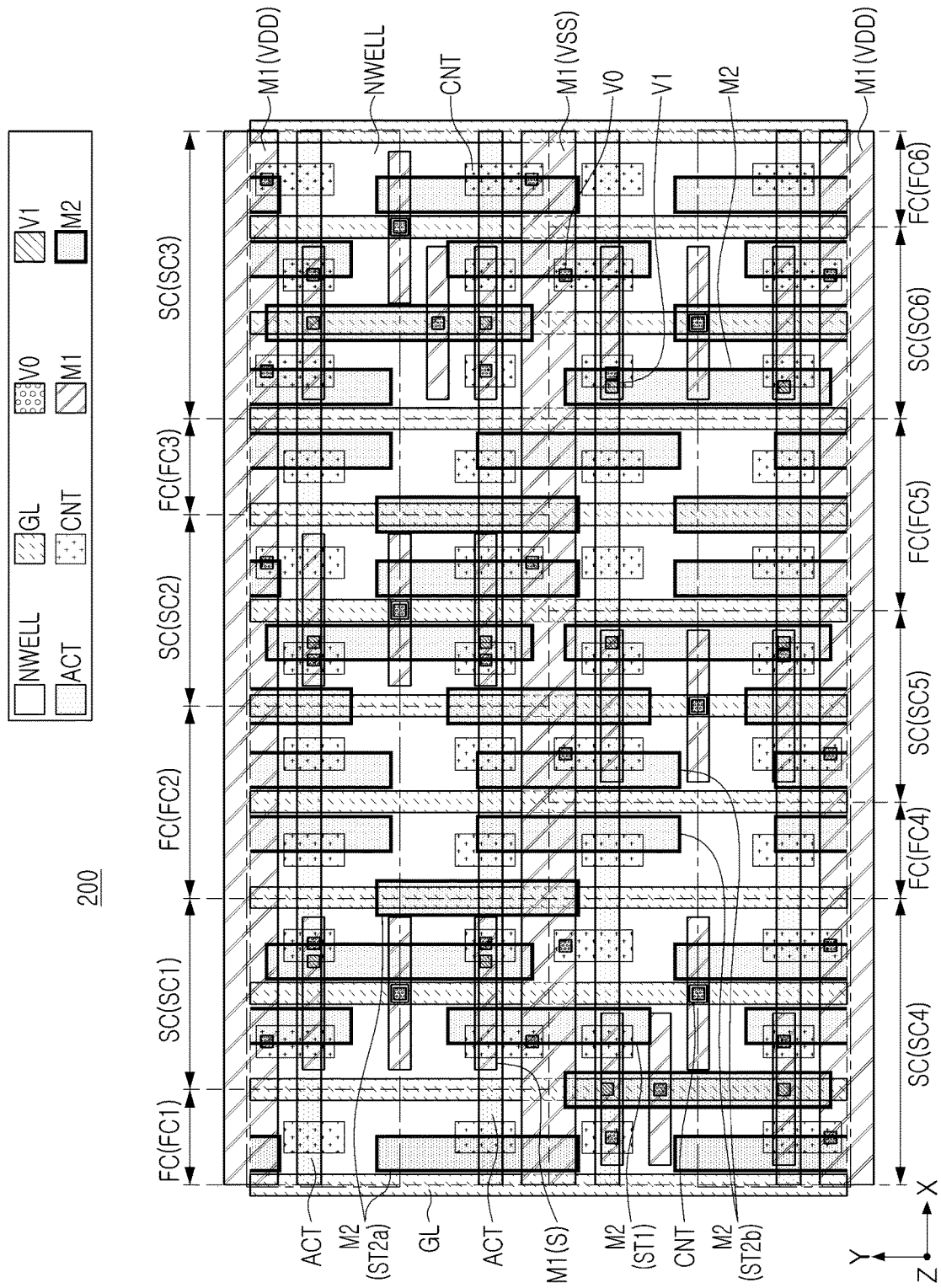
Figure 9C:
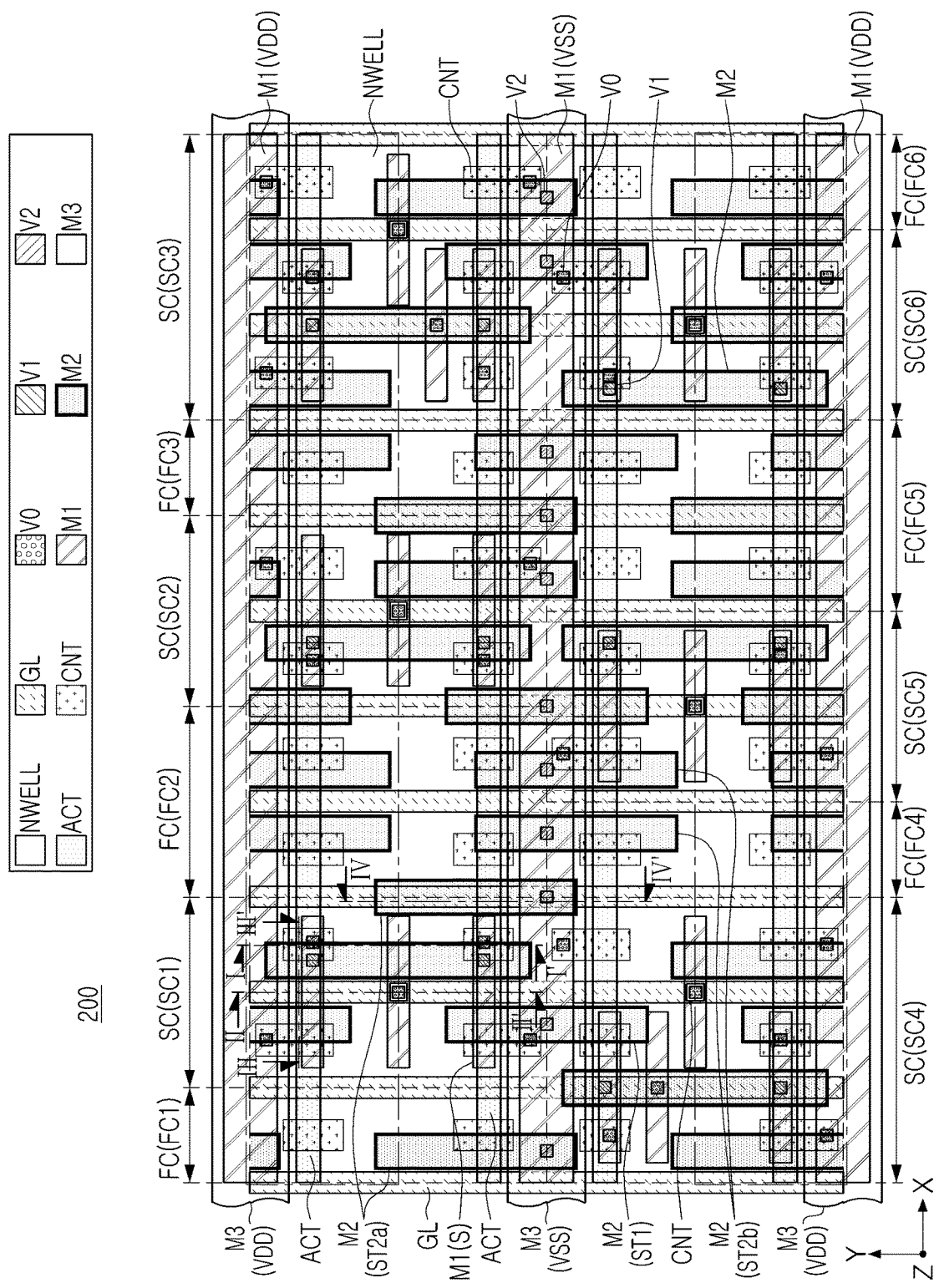

FIGS. 9A to 9C are layout diagrams of semiconductor devices according to example embodiments. FIG. 9B further illustrates staple lines in the layout of FIG. 9A, and FIG. 9C further illustrates second vias and third power transmission lines in the layout of FIG. 9B. Referring to FIG. 9A, a semiconductor device 200 includes standard cell areas SC including first to sixth standard cells SC1-SC6 and filler cell areas FC including first to sixth filler cells FC1-FC6, disposed in the X direction and the Y direction. The first, second, fifth and sixth standard cells SC1, SC2, SC5 and SC6 are standard cells including the inverter circuit of FIG. 8A, and the third and fourth standard cells SC3 and SC4 are standard cells including the NAND circuit of FIG. 8B. However, the arrangement of the standard cell areas SC and the filler cell areas FC is an example and may be variously changed according to example embodiments.

Each of the first to sixth standard cells SC1-SC6 may include well regions, such as N well regions (NWELL), a pair of active regions ACT extending in the X direction, gate lines GL extending in the Y direction, contacts CNT connected to the active regions ACT and the gate lines GL, lower vias V0 connected to the contacts CNT, first interconnection lines M1 connected to the lower vias V0, first vias V1 connected to the first interconnection lines M1, and second interconnection lines M2 connected to the first vias V1. The first to sixth filler cells FC1-FC6 may include a pair of active regions ACT extending in the X direction, gate lines GL extending in the Y direction, contacts CNTs connected to the active regions ACT and the gate lines GL, and first interconnection lines M1. The first to sixth filler cells FC1-FC6 may be a region in which dummy components or dummy semiconductor elements are disposed.

In FIGS. 9A to 9C, for convenience of understanding, portions of the configurations disposed over the boundaries of the standard cell areas SC and the filler cell areas FC outside the standard cell areas SC and the filler cell areas FC are illustrated together. The active regions ACT may include, for example, one or more active fins respectively extending in the X direction. The active regions ACT may be disposed in well regions of different conductivity types, and may be connected to upper contacts CNT. The active regions ACT disposed in the N well regions NWELL have N-type conductivity, and the active regions ACT not disposed in the N well regions NWELL have P-type conductivity.

In the first to sixth standard cells SC1-SC6, in the case of the active regions ACT, to provide the inverter circuit and the NAND circuit of FIGS. 8A and 8B, the contact CNT connected to one of the pair of active regions ACT is connected to the first high-power transmission line M1(VDD) among the first interconnection lines M1 through the lower via V0, and the contact CNT connected to the other is connected to the first low-power transmission line M1(VSS) among the first interconnection lines M1 via the lower via V0.

In the first to sixth filler cells FC1-FC6, the active regions ACT may be formed in a continuous pattern with the first to sixth standard cells SC1-SC6 in the X direction. In example embodiments, the active regions ACT in the first to sixth filler cells FC1-FC6 may be separated from the active regions ACT of the first to sixth standard cells SC1-SC6 by a separation layer or the like, thereby being implemented as the form of dummy active regions, but are not limited thereto.

The gate lines GL include a gate electrode and a dummy gate electrode, and may intersect the active regions ACT. The gate lines GL may provide a pull-up device and a pull-down device of the inverter circuit and the NAND circuit together with the active region ACT. In the inverter circuit of FIG. 8A, since the gates of the pull-up device TR1 and the pull-down device TR2 are connected to each other, the gate line GL may be shared between a pair of active regions ACT. The gate lines GL may be connected to the first interconnection lines M1 through the contacts CNT, which may be a signal transmission line M1(S) among the first interconnection lines M1. In example embodiments, gate lines GL commonly disposed on both ends of the first to sixth standard cells SC1-SC6 in the X direction and gate lines GL disposed in the first to sixth filler cells FC1-FC6 may include a dummy gate electrode. Accordingly, the gate lines GL disposed in the first to sixth filler cells FC1-FC6 may be referred to as a dummy gate structure or a filler gate structure or the like. The contacts CNT may connect the active regions ACT and the gate lines GL to the lower vias V0 provided thereon. In the first to sixth filler cells FC1-FC6, the contacts CNT may be dummy contacts that are not connected to an upper interconnection line, such as the first interconnection line M1.

The first interconnection lines M1 are interconnection lines disposed on the active regions ACT and the gate lines GL, and may extend in the X direction. The first interconnection lines M1 may include first power transmission lines M1(VDD) and M1(VSS), and first signal transmission lines M1(S). The first power transmission lines M1(VDD) and M1(VSS) may supply different first and second power voltages VDD and VSS to the semiconductor elements, respectively, as described above with reference to FIG. 2, and may be electrically connected to source/drain regions on the active regions ACT. The signal transmission lines M1(S) may be signal transmission lines for supplying signals to semiconductor elements, and may be electrically connected to the gate lines GL.

The regions of the first interconnection lines M1 positioned inside the first to sixth standard cells SC1-SC6, respectively, may have the same width as each other in the Y direction, but the sizes of the regions are not limited thereto. For example, the entire width of each of the first power transmission lines M1(VDD) and M1(VSS) without considering the boundary of a standard cell 100S may also be the same as the width of the first signal transmission lines M1(S).

The first to sixth filler cells FC1-FC6 may include first power transmission lines M1(VDD) and M1(VSS) extending from the first to sixth standard cells SC1-SC6. The second interconnection lines M2 are interconnections disposed on the first interconnection lines M1 and may extend in the Y direction. The second interconnection lines M2 may be connected to the first interconnection lines M1 through the first vias V1. The second interconnection lines M2 illustrated in FIG. 9A may be a portion of the second signal transmission lines, for example, lines connecting the first interconnection lines M1 to each other within each of the first to sixth standard cells SC1-SC6.

Referring to FIG. 9B, the semiconductor device 200 may further include a routing structure disposed on upper portions of first to seventh standard cells SC1-SC7 and first to seventh filler cells FC1-FC7. The routing structure may include first and second staple lines M2(ST1), M2(ST2a) and M2(ST2b) as illustrated in FIG. 9B. The first and second staple lines M2(ST1), M2(ST2a) and M2(ST2b) correspond to the second interconnection lines M2, and may be arranged to have the same thickness as and at the same height as the second interconnection lines M2 in the first to seventh standard cells SC1-SC7 described above with reference to FIG. 9A. In example embodiments, the semiconductor device 200 may further include, in a region not illustrated, as the second interconnection lines M2, second power transmission lines M2(VDD) and M2(VSS) and second signal transmission lines M2(S), as similar to those illustrated in FIG. 3.

The first and second staple lines M2(ST1), M2(ST2a) and M2(ST2b) may be disposed to overlap the boundary between the first to seventh standard cells SC1-SC7 and the first to seventh filler cells FC1-FC7, adjacent to each other in the Y direction. The first and second staple lines M2(ST1), M2(ST2a) and M2(ST2b) may be arranged not only on the upper portions of the standard cell areas SC but also on the upper portions of the filler cell areas FC. Accordingly, the first and second staple lines M2(ST1), M2(ST2a) and M2(ST2b) may be disposed to overlap the first to seventh filler cells FC1-FC7 as well as the first to seventh standard cells SC1-SC7. For the detailed description of each of the first and second staple lines M2(ST1), M2(ST2a) and M2(ST2b), the descriptions above with reference to FIG. 3 may be equally applied thereto.

Referring to FIG. 9C, the routing structure of the semiconductor device 200 may further include third interconnection lines M3 connected to the second interconnection lines M2 through second vias V2. In FIG. 9C, only the third high-power transmission lines M3(VDD) and the third low-power transmission lines M3(VSS) corresponding to the third power transmission lines, among the third interconnection lines M3, are illustrated. The third power transmission lines M3(VDD) and M3(VSS) may be disposed to overlap the first power transmission lines M1(VDD) and M1(VSS). The third power transmission lines M3(VDD) and M3(VSS) may be connected to the second interconnection lines M2 through the second vias V2 in the region overlapping the second interconnection lines M2. In addition, the description of the third power transmission lines M3(VDD) and M3(VSS) described above with reference to FIG. 7 may be equally applied.

FIGS. 10A to 10D are cross-sectional views illustrating a semiconductor device according to example embodiments. FIGS. 10A to 10D illustrate cross-sections of the semiconductor device of FIG. 9C, taken along lines I-I', II-II', III-III', and IV-IV'. For convenience of description, only the main components of the semiconductor device are illustrated in FIGS. 10A to 10D. Referring to FIGS. 10A to 10D, the semiconductor device 200 includes a substrate 101, active regions ACT including active fins 105, a device isolation layer 110, source/drain regions 120, a gate structure 140 including a gate electrode layer 145, a lower interlayer insulating layer 130, contacts (CNT), an upper interlayer insulating layer 150, a lower via V0, first interconnection lines M1, first vias V1 disposed on the first interconnection lines M1, second interconnection lines M2, second vias V2, and third interconnection lines M3. The semiconductor device 200 may further include etch stop layers 160 disposed on a lower surface of the upper interlayer insulating layer 150, and barrier layers 170 disposed along the lower surfaces of the interconnection lines M1, M2 and M3 and the vias V0, V1 and V2. The semiconductor device 200 may include FinFET devices in which the active regions ACT include the active fins 105 having a fin structure.

The substrate 101 may have an upper surface extending in the X direction and the Y direction. The substrate 101 may include a semiconductor material, such as a group IV semiconductor, a group III-V compound semiconductor, or a group II-VI compound semiconductor. For example, the group IV semiconductor may include silicon, germanium or silicon-germanium. The substrate 101 may be provided as a bulk wafer, an epitaxial layer, an epitaxial layer, a Silicon-On-Insulator (SOI) layer, a Semiconductor-On-Insulator (SeOI) layer or the like. The substrate 101 may include doped regions such as an N well region (NWELL).

Figure 10A:
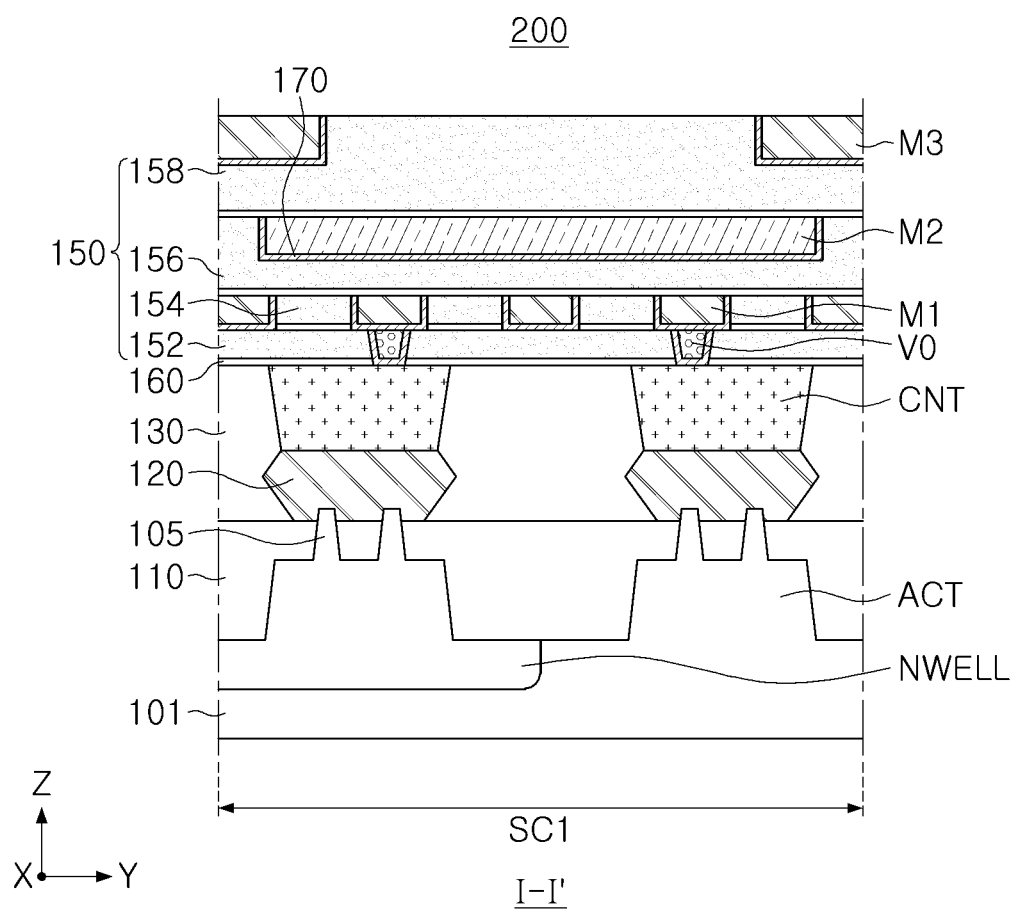
FIGS. 10A to 10D are cross-sectional views illustrating a semiconductor device according to example embodiments.
Figure 10B:
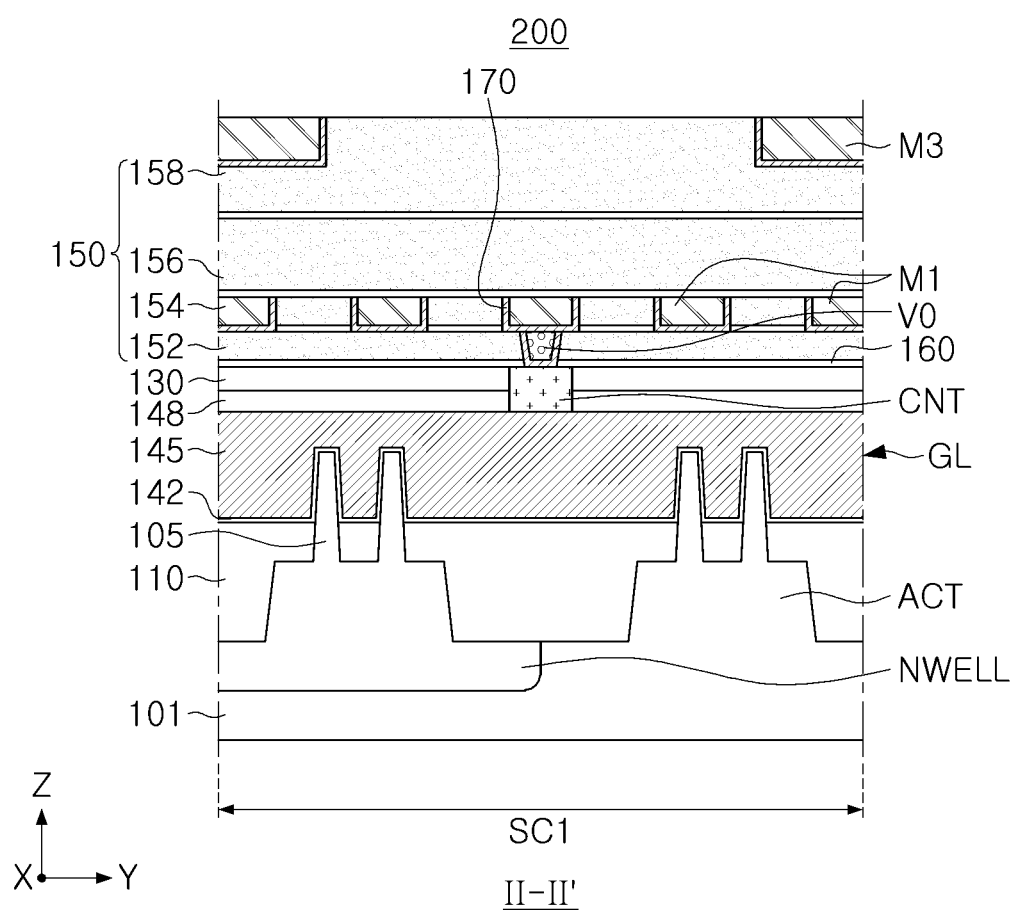
Figure 10C:
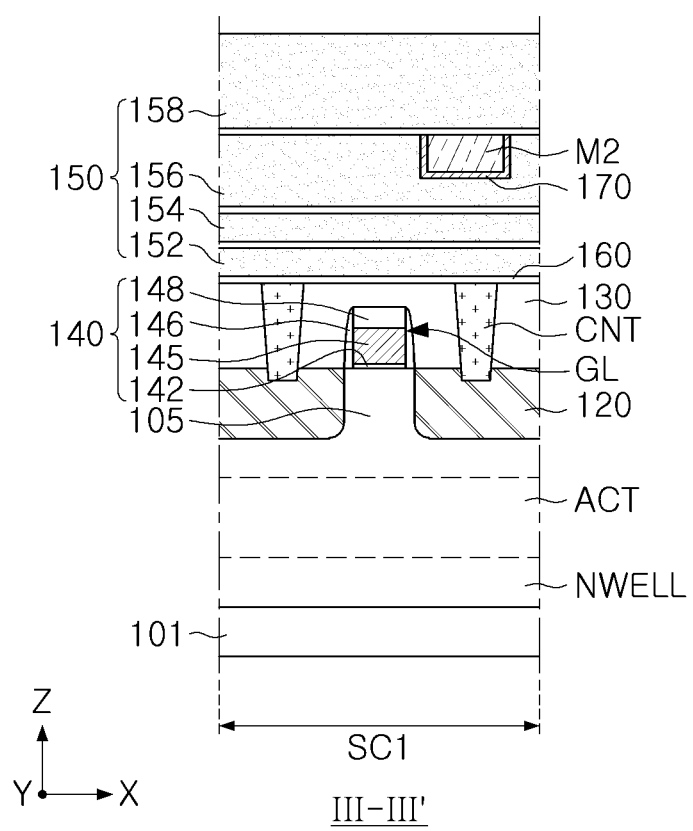

The device isolation layer 110 may define the active regions ACT in the substrate 101. The device isolation layer 110 may be formed by, for example, a shallow trench isolation (STI) process. As illustrated in FIG. 10A, the device isolation layer 110 may include a region extending relatively deeply into the lower portion of the substrate 101 between adjacent active regions ACT, but the configuration of the device isolation layer is not limited thereto. According to example embodiments, the device isolation layer 110 may have a curved upper surface having a higher level as it is adjacent to the active fins 105. The device isolation layer 110 may be formed of an insulating material, and may include, for example, oxide, nitride, or a combination thereof.

The active regions ACT are defined by the device isolation layer 110 in the substrate 101 and may be disposed to extend in a first direction, for example, in the X direction. The active fins 105 may have a shape protruding from the substrate 101. Upper ends of the active fins 105 may be disposed to protrude to a predetermined height from an upper surface of the device isolation layer 110. The active fins 105 may be formed as a portion of the substrate 101 or may include an epitaxial layer grown from the substrate 101. For example, the active fins 105 are partially recessed on both sides of the gate structures 140, and the source/drain regions 120 may be disposed on the recessed active fins 105. According to example embodiments, the active regions ACT may have doped regions including impurities. For example, the active fins 105 may include impurities diffused from the source/drain regions 120 in the region in contact with the source/drain regions 120. In example embodiments, the active fins 105 may be omitted, and in this case, the active regions ACT may have a structure having a flat upper surface.

The source/drain regions 120 may be disposed on recess regions in which the active fins 105 are recessed, on both sides of the gate structures 140. The source/drain regions 120 may be provided as the source region or the drain region of transistors. The upper surface of the source/drain regions 120 may be located at the same or similar height level as the lower surface of the gate structures 140 in a cross section in the X direction of FIG. 10C. However, the relative heights of the source/drain regions 120 and the gate structures 140 may be variously changed according to example embodiments.

The source/drain regions 120 may have a merged shape, between adjacent active fins 105 in the Y direction, as illustrated in FIG. 10A, but the shape is not limited thereto. The source/drain regions 120 may have the shape of an angled side surface in the cross section in the Y direction of FIG. 10A. However, in example embodiments, the source/drain regions 120 may have various shapes, for example, any one of polygonal, circular, elliptical, and rectangular shapes.

The source/drain regions 120 may be formed of an epitaxial layer, and may include, for example, silicon (Si), silicon germanium (SiGe), or silicon carbide (SiC). Also, the source/drain regions 120 may further include impurities such as arsenic (As) and/or phosphorus (P). In example embodiments, the source/drain regions 120 may include a plurality of regions including elements and/or doping elements of different concentrations.

The gate structures 140 may be disposed to extend in one direction, for example, in the Y direction, intersecting the active regions ACT on upper portions of the active regions ACT. Channel regions of the transistors may be formed in the active fins 105 intersecting the gate structures 140. The gate structure 140 may include a gate insulating layer 142, the gate electrode layer 145, gate spacer layers 146, and a gate capping layer 148.

The gate insulating layer 142 may be disposed between the active fin 105 and a gate electrode layer 165. In example embodiments, the gate insulating layer 142 may be formed of a plurality of layers, or may be disposed to extend on the side surfaces of the gate electrode layer 145. The gate insulating layer 142 may include an oxide, nitride, or high-k material. The high-k material may indicate a dielectric material having a higher dielectric constant than that of a silicon oxide film ($SiO_2$).

The gate electrode layer 145 may include a conductive material, for example, a metal nitride such as titanium nitride (TiN), tantalum nitride (TaN), or tungsten nitride (WN), and/or a metallic material such as aluminum (Al), tungsten (W), molybdenum (Mo) or the like, or a semiconductor material such as doped polysilicon. The gate electrode layer 145 may also be comprised of two or more multiple layers. The gate electrode layer 145 may be disposed to be divided in the Y direction between at least some adjacent transistors, depending on the circuit configuration of the semiconductor device 200. For example, the gate electrode layer 145 may be divided by a separate gate separation layer.

The gate spacer layers 146 may be disposed on both sides of the gate electrode layer 145. The gate spacer layers 146 may insulate the source/drain regions 120 from the gate electrode layer 145. The gate spacer layers 146 may have a multilayer structure according to example embodiments. The gate spacer layers 146 may be formed of oxide, nitride, and oxynitride, and in detail, may be formed of a low dielectric constant film. The gate spacer layers 146 may include at least one of, for example, SiO, SiN, SiCN, SiOC, SiON, and SiOCN.

The gate capping layer 148 may be disposed on the gate electrode layer 145, and the lower and side surfaces of the gate capping layer may be surrounded by the gate electrode layer 145 and the gate spacer layers 146, respectively. The gate capping layer 148 may be formed of, for example, oxide, nitride, and oxynitride.

The lower interlayer insulating layer 130 may be disposed to cover the source/drain regions 120 and the gate structures 140. The lower interlayer insulating layer 130 may include at least one of, for example, oxide, nitride and oxynitride, and may include a low dielectric constant material.

The contacts CNT penetrate through the lower interlayer insulating layer 130 to be connected to the source/drain regions 120, or penetrate through the lower interlayer insulating layer 130 and the gate capping layer 148 to be connected to the gate electrode layer 145, and may apply an electrical signal to the source/drain regions 120 and the gate electrode layer 145. The contacts CNTs may be disposed to recess the source/drain regions 120 to a predetermined depth, but the configuration is not limited thereto. The contacts CNT may include a conductive material, for example, a metal material such as tungsten (W), aluminum (Al), copper (Cu), or a semiconductor material such as doped polysilicon. According to example embodiments, the contacts CNT may include a barrier metal layer disposed along the outer surface. According to example embodiments, the contacts CNT may further include a metal-semiconductor layer, such as a silicide layer disposed at an interface in contact with the source/drain regions 120 and the gate electrode layer 145.

The upper interlayer insulating layer 150 covers the contacts CNT and may be disposed at the same level as the interconnection structure including the lower vias V0, the first interconnection lines M1, the first vias V1, the second interconnection lines M2, the second vias V2 and the third interconnection line M3. The upper interlayer insulating layer 150 includes first to fourth insulating layers 152, 154, 156 and 158, and the first to fourth insulating layers 152, 154, 156 and 158 may be disposed at the same height levels as the lower vias V0, the first interconnection lines M1, the first via V1 and the second interconnection lines M2, and the second vias V2 and the third interconnection line M3, respectively. The upper interlayer insulating layer 150 may be formed of silicon oxide or a low dielectric constant material. The upper interlayer insulating layer 150 may include at least one of, for example, SiO, SiN, SiCN, SiOC, SiON, and SiOCN.

The etch stop layers 160 may be disposed on the respective lower surfaces of the first to fourth insulating layers 152, 154, 156 and 158. The etch stop layers 160 may function as the etch stop layers in the etching process for forming the lower vias V0, the first interconnection lines M1, the first vias V1, and the second vias V2. The etch stop layers 160 may include a high-k material and may include, for example, silicon nitride or aluminum oxide.

The lower vias V0, the first interconnection lines M1, the first vias V1, the second interconnection lines M2, the second vias V2 and the third interconnection line M3, which constitute the interconnection structure, may be sequentially stacked and disposed from the lower portion. The first interconnection lines M1, the second interconnection lines M2, and the third interconnection lines M3 may have a relatively greater thickness as they are disposed on a higher upper portion, but the configuration is not limited thereto. The interconnection structure may respectively include a conductive material. For example, the interconnection structure may respectively include at least one of aluminum (Al), copper (Cu), and tungsten (W).

Figure 10D:
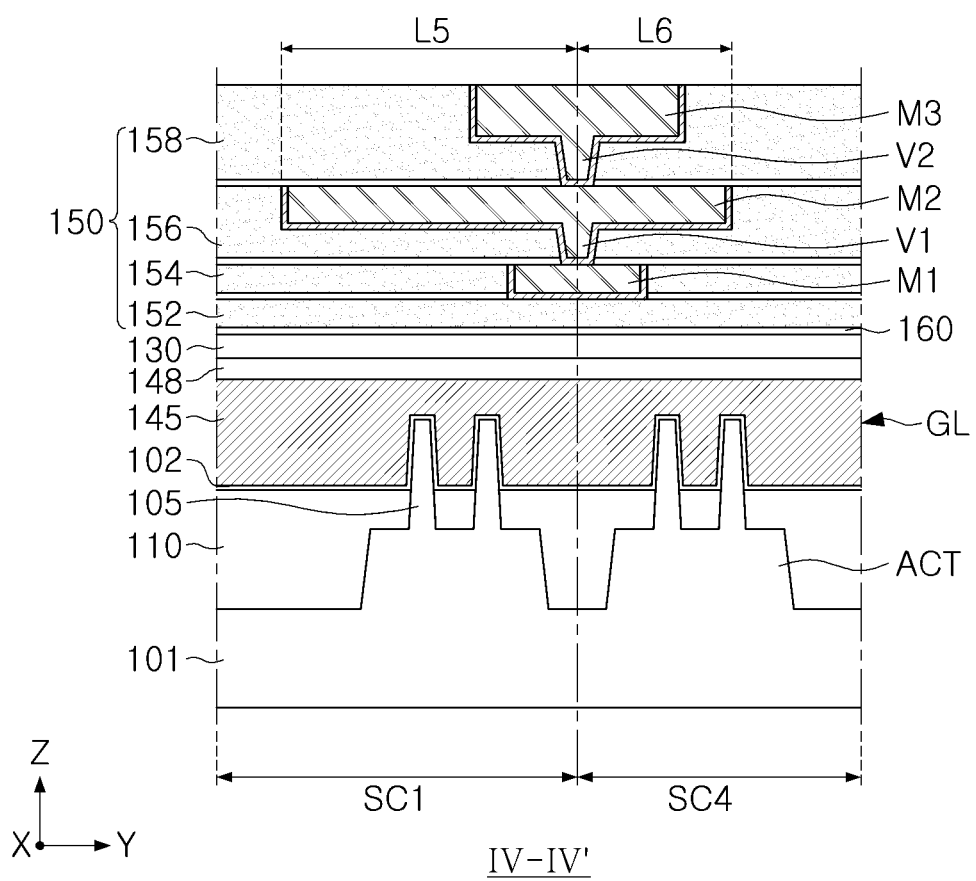

The barrier layers 170 may be disposed in the interconnection structure along the lower surfaces of the interconnection lines M1, M2 and M3 and the vias V0, V1 and V2. In detail, the barrier layers 170 may be disposed along the lower surfaces and side surfaces of each of the lower vias V0, the first interconnection lines M1, the first vias V1, the second interconnection lines M2, the second vias V2, and the third interconnection lines M3. In detail, the barrier layers 170 may be continuously extended to the lower surfaces of the first vias V1 along the side surfaces of the first vias V1 from the side surfaces and the lower surfaces of the second interconnection lines M2, as illustrated in FIG. 10D. The barrier layers 170 may continuously extend from the side surfaces and the lower surfaces of the third interconnection lines M3 to the lower surfaces of the second vias V2 along the side surfaces of the second vias V2. The arrangement of the barrier layers 170 as described above is provided as the lower vias V0 and the first interconnection lines M1 are respectively formed by a single damascene process, and the first vias V1 and the second interconnection lines M2, and the second vias V2 and the third interconnection line M3 are respectively formed by a dual damascene process. The barrier layers 170 may include at least one of titanium (Ti), tantalum (Ta), cobalt (Co), titanium nitride (TiN), and tantalum nitride (TaN).

As illustrated in FIG. 10D, the second interconnection line M2 disposed to traverse the boundary of the first and fourth standard cells SC1 and SC4 adjacent to each other in the Y direction may be the 2-1 staple line M2(ST2a) of FIG. 9A. Therefore, as described above with reference to FIG. 4A, the second interconnection line M2 may have a greater length L5 overlapping with the first standard cell SC1 than a length L6 overlapping the fourth standard cell SC4. The second interconnection line M2 may connect the first interconnection line M1, which corresponds to the first low-power transmission line M1(VSS) disposed therebelow, and the third interconnection line M3, which corresponds to the third low-power transmission lines M3(VSS) disposed thereon. For example, the second interconnection line M2 which is the 2-1 staple line M2(ST2a) extends relatively short in the Y direction, and may connect the first interconnection line M1 and the third interconnection line M3 which are power rails extending in the X direction perpendicular to the Y direction.

Figure 11:
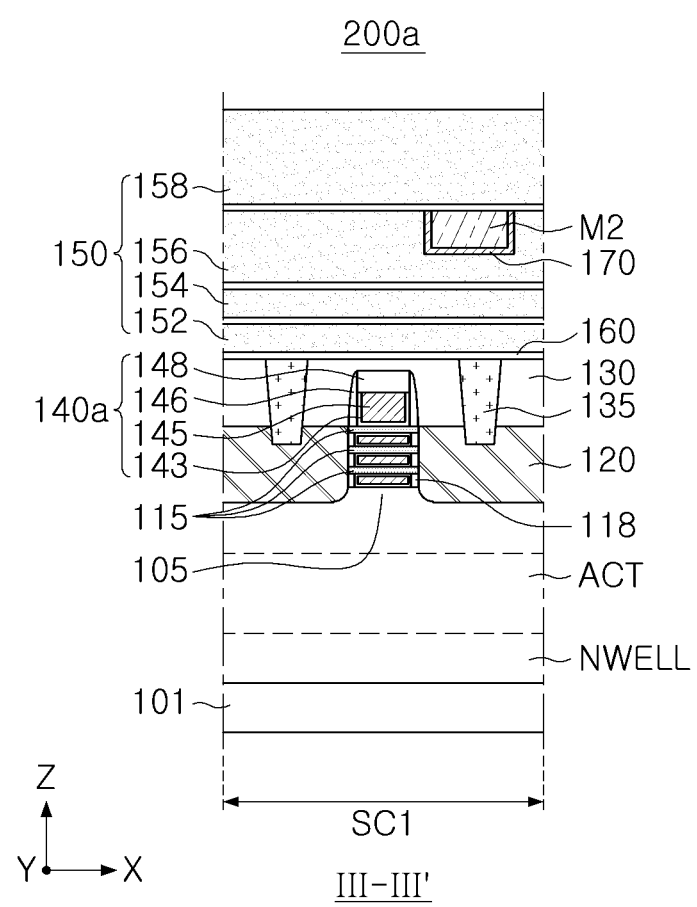
FIG. 11 is a cross-sectional view illustrating a semiconductor device according to example embodiments.

FIG. 11 is a cross-sectional view illustrating a semiconductor device according to example embodiments. FIG. 11 illustrates an area corresponding to FIG. 10C. Referring to FIG. 11, a semiconductor device 200a may further include a plurality of channel layers disposed on the active regions ACT to 115 to be spaced apart from each other in a vertical direction, and inner spacer layers 118 disposed in parallel with the gate electrode layer 145, between the plurality of channel layers 115. The semiconductor device 200a may include transistors of a gate-all-around type structure in which the gate structure 140a is disposed between the active fin 105 and the channel layers 115 and between the plurality of nano-sheet-shaped channel layers 115. For example, the semiconductor device 200a may include transistors of a multi-bridge channel FET (MBCFET™) structure provided by the channel layers 115, the source/drain regions 120 and the gate structure 140a.

The plurality of channel layers 115 may be disposed in a plurality of two or more spaced apart from each other, in a direction perpendicular to the upper surface of the active fin 105, on the active region ACT, for example, in the Z direction. The channel layers 115 may be spaced apart from the upper surfaces of the active fin 105 while being connected to the source/drain regions 120. The channel layers 115 may have the same or similar width to the active fin 105 in the Y direction, and may have the same or similar width to the gate structure 140a in the X direction. However, according to example embodiments, the channel layers 115 may also have a reduced width such that side surfaces of the channel layers 115 are positioned below the gate structure 140a in the X direction.

The plurality of channel layers 115 may be formed of a semiconductor material, and may include, for example, at least one of silicon (Si), silicon germanium (SiGe), and germanium (Ge). The channel layers 115 may be formed of, for example, the same material as that of the substrate 101. The number and shape of channel layers 115 constituting one channel structure may be variously changed in example embodiments. For example, according to example embodiments, a channel layer may be further positioned in an area in which the active fin 105 contacts the gate electrode layer 145.

The gate structure 140a may be disposed on the active fins 105 and the plurality of channel layers 115, to extend while intersecting the active fins 105 and the plurality of channel layers 115. A channel region of transistors may be formed in the active fins 105 and the channel layers 115 intersecting the gate structure 140a. In this embodiment, the gate insulating layer 142 may be disposed not only between the active fin 105 and the gate electrode layer 145, but also between the plurality of channel layers 115 and the gate electrode layer 145. The gate electrode layer 145 may be disposed on the active fins 105 to extend onto the upper portions of the plurality of channel layers 115, while filling between the plurality of channel layers 115. The gate electrode layer 145 may be spaced apart from the plurality of channel layers 115 by the gate insulating layer 142.

The inner spacer layers 118 may be disposed in parallel with the gate electrode layer 145, between the plurality of channel layers 115. The gate electrode layer 145 may be spaced and electrically isolated from the source/drain regions 120 by the inner spacer layers 118. The inner spacer layers 118 may have a flat side surface facing the gate electrode layer 145 or an inwardly convexly rounded shape toward the gate electrode layer 145. The inner spacer layers 118 may be formed of oxide, nitride, and oxynitride, and in detail, may be formed of a low dielectric constant film. According to example embodiments, the inner spacer layers 118 may be omitted In example embodiments, the semiconductor device 200a having the MBCFET™ structure may also be additionally disposed in a region of the semiconductor device described above with reference to FIGS. 9A to 9C, along with the semiconductor device 200 of FIGS. 10A to 10D. Further, in example embodiments, the semiconductor device may also include a vertical field effect transistor (vertical FET) in which an active region extending vertically to an upper surface of the substrate 101 and a gate structure surrounding the active region are disposed, in at least one region.

As set forth above, according to example embodiments, by disposing staple lines in an optimized form in second interconnection lines, a semiconductor device having improved integration and reliability may be provided.

While example embodiments have been illustrated and described above, it will be apparent to those skilled in the art that modifications and variations could be made without departing from the scope of the present inventive concept as defined by the appended claims.

What is claimed is:
1. A semiconductor device, comprising:
a plurality of standard cells arranged in a first direction on an upper surface of a substrate, and in a second direction perpendicular to the first direction, said plurality of standard cells respectively including: an active region, a gate structure on the active region, source/drain regions extending adjacent the active region and on both sides of the gate structure, and first interconnection lines, which include first power transmission line and a first signal transmission line; and a routing structure disposed on the plurality of standard cells, said routing structure including second interconnection lines electrically connected to the first interconnection lines;

wherein the plurality of standard cells include first and second standard cells, which extend adjacent to each other in the second direction; and wherein the second interconnection lines include:
- at least one or more second power transmission lines electrically connected to the first power transmission line and arranged in a line along an entirety of the standard cells arranged in the second direction;
- a second signal transmission line electrically connected to the first signal transmission line and disposed on a portion of the standard cells; and
- a first staple line electrically connected to the first power transmission line, disposed on a boundary between the first and second standard cells to overlap the first standard cell by a first length in the second direction and to overlap the second standard cell by a second length, different from the first length, in the second direction.

2. The semiconductor device of claim 1, wherein the first staple line has a third length in the second direction, and the standard cells have a fourth length greater than the third length in the second direction.

3. The semiconductor device of claim 1, wherein the second length is greater than the first length, and a ratio of the first length to the second length is greater than 1/6.

4. The semiconductor device of claim 1, wherein the first power transmission line extends in the first direction; and wherein the second power transmission line, the second signal transmission line, and the first staple line extend in the second direction.

5. The semiconductor device of claim 4, further comprising a third power transmission line extending in the first direction, which is electrically connected to the second power transmission line and the first staple line.

6. The semiconductor device of claim 5, wherein the third power transmission line is disposed to overlap an entirety of the first power transmission line.

7. The semiconductor device of claim 4, wherein the first staple line has an end spaced apart in the second direction from an end of the second power transmission line or an end of the second signal transmission line adjacent to the first staple line in the first direction.

8. The semiconductor device of claim 1, wherein the routing structure further includes vias vertically connecting the first interconnection lines and the second interconnection lines; and wherein the first staple line is connected to the first power transmission line by the vias in an area overlapping the first power transmission line.

9. The semiconductor device of claim 1, wherein the first power transmission line includes high power rails and low power rails alternately disposed in the second direction, which are configured to supply different first and second power voltages, respectively; and wherein the second power transmission line includes a first high-power transmission line electrically connected to the high power rails and a second low-power transmission line electrically connected to the low power rails.

10. The semiconductor device of claim 1, wherein the second interconnection lines further include a second staple line electrically connected to the first power transmission line and respectively overlapping the first standard cell and the second standard cell with substantially the same length.

11. The semiconductor device of claim 1, wherein the second interconnection lines further comprise a third staple line electrically connected to the first power transmission line and extending further than one of the standard cells.

12. The semiconductor device of claim 1, wherein the second interconnection lines further comprise a fourth staple line electrically connected to the first power transmission line and extending with substantially the same length from a center line of one of the standard cells.

13. The semiconductor device of claim 1, further comprising filler cells disposed between at least portions of the standard cells and respectively including a filler active region extending from the active region of the standard cell, a filler gate structure intersecting the filler active region, and the first interconnection lines extending from the standard cells; and wherein the second interconnection lines further include a fifth staple line electrically connected to the first power transmission line and disposed on a boundary between the filler cells adjacent to each other in the second direction or a boundary between the filler cells and the standard cell.

14. A semiconductor device, comprising:
first and second standard cells including respective semiconductor elements and first interconnection lines electrically connected to the semiconductor elements, on a substrate; and a routing structure disposed on the first and second standard cells, said routing structure including second interconnection lines electrically connected to the first interconnection lines;

wherein the first interconnection lines include a first power transmission line, which is configured to supply power to the semiconductor element, and a first signal transmission line electrically coupled to the semiconductor element; and wherein the second interconnection lines include:
- a second power transmission line electrically connected to the first power transmission line and extending by a first length;
- a second signal transmission line electrically connected to the first signal transmission line; and
- a staple line electrically connected to the first power transmission line, disposed on a boundary between the first and second standard cells, and extending by a second length, less than the first length.

15. The semiconductor device of claim 14, wherein the first power transmission line extends in a first direction along the boundary of the first and second standard cells; and wherein the staple line overlaps the first power transmission line, and extends in a second direction, perpendicular to the first direction.

16. The semiconductor device of claim 14, wherein the second signal transmission line has a third length less than the first length and greater than the second length.

17. The semiconductor device of claim 14, wherein the routing structure further includes vias vertically connecting the first interconnection lines and the second interconnection lines, and a barrier layer extending from side and lower surfaces of the second interconnection lines to side and lower surfaces of the vias.

18. The semiconductor device of claim 14, wherein the staple line overlaps the first standard cell by a fourth length in an extension direction and overlaps the second standard cell by a fifth length different from the fourth length.

19. A semiconductor device, comprising:

a plurality of standard cells disposed on a substrate, said plurality of standard cells respectively including an active region, a gate structure on the active region, source/drain regions adjacent the active region on both sides of the gate structure, and first interconnection lines including first power transmission lines; and a routing structure on the standard cells, the routing structure including second interconnection lines including staple lines electrically connected to the first power transmission lines, and third interconnection lines including third power transmission lines disposed on the second interconnection lines to be electrically connected to the staple lines;

wherein the first power transmission lines extend in a first direction along boundaries of the standard cells;

wherein the staple lines are configured to traverse boundaries between the standard cells among the boundaries of the standard cells, overlap the first power transmission lines and the third power transmission lines, and extend in a second direction, perpendicular to the first direction;

wherein the third power transmission lines overlap the first power transmission lines to extend in the first direction; and wherein the staple lines are disposed asymmetrically in the second direction with respect to the boundaries between the standard cells.

* * * * *